US005846600A

United States Patent [19]

Yamada et al.

[11] Patent Number: 5,846,600

[45] Date of Patent: Dec. 8, 1998

[54] PROCESSES FOR PRODUCING COATED PARTICLES

[75] Inventors: Yukiyoshi Yamada; Tadashi Fuyuki; Satoshi Akiyama; Yoshiaki Hamada; Eisuke Kuroda, all of Saitama-ken, Japan

[73] Assignee: Nisshin Flour Milling Co., Ltd., Tokyo, Japan

[21] Appl. No.: 416,820

[22] PCT Filed: Aug. 12, 1994

[86] PCT No.: PCT/JP94/01344

§ 371 Date: Apr. 11, 1995

§ 102(e) Date: Apr. 11, 1995

[87] PCT Pub. No.: WO95/05493

PCT Pub. Date: Feb. 23, 1995

[30] Foreign Application Priority Data

Aug. 12, 1993 [JP] Japan .................................... 5-219268

[51] Int. Cl.[6] .............................. B05D 7/00; C23C 16/00

[52] U.S. Cl. ........................... 427/213; 427/215; 118/716

[58] Field of Search .................................... 427/213, 215; 118/716

[56] References Cited

U.S. PATENT DOCUMENTS 4,314,525 2/1982 Hsu et al. .............................. 118/716
4,328,042 5/1982 Ostertag et al. ........................ 427/213
4,940,523 7/1990 Takeshima .

FOREIGN PATENT DOCUMENTS 375302 3/1991 Japan .

*Primary Examiner*—Shrive Beck
*Assistant Examiner*—Bret Chen
*Attorney, Agent, or Firm*—Weiser & Associates, P.C.

[57] ABSTRACT

The process for producing coated particles of the present invention is applicable to a process of producing coated particles by charging powder of core particles into the coating space and permitting a coat forming substance generated via a vapor phase or being in a vapor-phase state to contact against particles of the powder, and the process is characterized by dispersing powder of core particles having an average particle diameter of not more than 10 μm and a particle size distribution of $((D_M/5, 5D_M), \geqq 90\%)$ to adjust a dispersity β to at least 70%, and contacting the dispersed powder of the core particles with the coat forming substance. According to the present invention, individual particles can be covered with the coat forming substance even the particles are in powder of fine are particles or core particles consisting chiefly of fine particles, yielding no uncoated particles nor particles having uncoated portions caused by formation of coated agglomerates covered on the surface with the coat forming substance. In view of the fact that uncoated particles or particles having uncoated portion are not in existence, the merits on the industrial outputs are extremely large.

11 Claims, 12 Drawing Sheets

PROCESSES FOR PRODUCING COATED PARTICLES

TECHNICAL FIELD

This invention relates to a process for producing coated particles and an apparatus therefor. More specifically, the invention relates to a production process of the coated particles for coating coat forming substances on particles in a powder of fine core particles or core particles comprising mainly fine particles and an apparatus therefor.

BACKGROUND ART

Vapor-phase process in which inorganic materials, metallic materials and other coat forming substances are applied to provide coatings on the surfaces of the particles in the powder as films and various other forms theoretically have major features that are unattainable by other coating techniques, such as: (1) easy control of the atmosphere; (2) the selection of coat forming substances is basically unlimited and various kinds of substances including elemental metallic substances (e.g. active metals), alloys, nitrides, carbides, borides and oxides can be coated on the surfaces of the particles of the powder; (3) the highly pure substance can be coated; and (4) the coating weight of the coat forming substance can be controlled freely.

However, for the reasons to be set forth below, none of the vapor-phase process have been capable of forming substantially the coatings with the coat forming substances on each surface of the particles not larger than 10 $\mu$m in the powder of the fine core particles or the core particles comprising mainly fine particles.

That is, the particles in the powder of the fine core particles or the core particles comprising mainly the fine particles are cohesive enough to have a great tendency to agglomerate together, whereby almost all single particles form agglomerates. Since these agglomerates cannot be disintegrated unless they are subjected to a special action greater than their cohesive force, even if they are simply coated with the coat forming substances, eventually coated agglomerates in which the surfaces of the agglomerates are covered with the coating of the coat forming substances are yielded. This has caused a problem with the individual particles forming the agglomerates which suffer from uneven coating in that the surfaces of the particles located on the surfaces of the agglomerates have large coating weights whereas the particles located within the agglomerates are not covered at all.

With a view to solving above-described problems, attempts have already been made to coat the particles in a dispersed state in order to assure the coating of the individual particles in the powder of the fine core particles or the core particles comprising the fine particles.

For instance, Unexamined Published Japanese Patent Application (kokai) Sho 58-31076 teaches an apparatus and method, according to which a vessel placed in PVD equipment is charged with the particles in a powder of core particles and vibrated by an electromagnetic means so that the core particles in the vessel are rolled as they are coated by a PVD process. Unexamined Published Japanese Patent Application (kokai) Sho 61-30663 teaches an apparatus, according to which a vessel placed in PVD equipment is charged with the particles in a powder of core particles and vibrated by a mechanical means so that the core particles in the vessel are rolled as they are coated by a PVD process. However, in the actual practice with those apparatus or methods in which the vessel was vibrated so that the particles in the powder of core particles were rolled as they were provided with coatings, the necessary action for disintegrating the agglomerates of the particles in the powder of the fine core particles or the core particles comprising mainly the fine particles by applying a force exceeding their cohesive force could not be produced and, hence, the agglomerates could not be disintegrated; to the contrary, a granulating action developed to form agglomerates that were greater in number or size than before the powder of core particles was supplied into the vessel.

Unexamined Published Japanese Patent Application (kokai) Hei 3-153864 teaches an apparatus and method, according to which a rotating vessel having barriers and/or ridges and grooves in the inner surface is charged with core particles and rotated as the surfaces of the particles are coated by an evaporation method. The problem with this apparatus and method was that the necessary action for disintegrating the agglomerates of the particles in the powder of the fine core particles or the core particles comprising mainly the fine particles by applying a force exceeding their cohesive force could not be produced and, hence, the agglomerates could not be disintegrated and, what was more, an increased number or size of agglomerates would simply form.

Unexamined Published Japanese Patent Application (kokai) Sho 58-141375 teaches an apparatus in which the particles of a powder in a reactive gas atmosphere are suspended by the flow of the reactive gas under gravity and in which the surfaces of the particles are coated with the precipitating substance that forms by the chemical reaction involving the reactive gas. Unexamined Published Japanese Patent Application (kokai) Hei 2-43377 teaches a method in which fine particles placed under vacuum are fluidized as they are subjected to coating by a thermochemical reaction treatment. However, these techniques which utilized the fluidized bed of the particles in a powder of core particles which was formed by a gas flow or vibrations had the problem that it was practically impossible to fluidize the separate individual particles in the powder of the fine core particles or the core particles comprising mainly the fine particles, thus failing to disintegrate the agglomerates of the particles in the powder of the fine core particles or the core particles comprising mainly the fine particles.

Unexamined Published Japanese Patent Application (kokai) Sho 54-153789 teaches an apparatus in which a powder material is dropped within a vacuum vessel, where the metal vapor is generated to form a metal coating on the particles. Unexamined Published Japanese Patent Application (kokai) Sho 60-47004 teaches a method in which a monomer gas and the particles of a powder are introduced into a high-frequency plasma region in a vacuum vessel, where a coating film of an organic substance is formed by plasma-assisted polymerization. If the particles in the powder of the fine core particles or the core particles comprising mainly the fine particles were simply introduced as in the apparatus or method described above, agglomerates of the particles in the powder of the fine core particles or the core particles comprising mainly the fine particles could not be disintegrated.

Unexamined Published Japanese Patent Application (kokai) Sho 64-80437 teaches a method in which the agglomerates of core particles in powder are disintegrated by a sound wave consisting of low and high frequency waves so that they are fluidized to improve the coating efficiency. However, this method which imparts vibrations to the fluidized bed could not disintegrate the agglomerates of the particles in the powder of the fine core particles or the core particles comprising mainly the fine particles.

Unexamined Published Japanese Patent Application (kokai) Sho 62-250172 teaches an apparatus and method, according to which a powder that has been preliminarily treated by jet milling is allowed to stay within a chamber for heat treatment under vacuum, where it is subjected to a heat treatment and thence dropped under gravity through a powder feeder into a cylinderal sputtering chamber equipped with a vertical target, whereby the particles in powder are provided with a coating. Unexamined Published Japanese Patent Application (kokai) Hei 2-153068 teaches an apparatus and method, according to which a powder that has been preliminarily treated by jet milling is allowed to stay within a chamber for heat treatment under vacuum, where it is subjected to a heat treatment and thence introduced through a powder feeder into a rotary vessel accommodating a sputter source within a sputtering chamber in the form of a powder, with sputtering being effected as the vessel is rotated. In the apparatus and method, the powder is dispersed temporarily only when it has been treated by jet milling, but these technique involve structure that this powder is allowed to stay in the heating step before coating. Since they are such method, even if the powder is dispersed temporarily in a primary particle state by jet milling treatment, because of this staying of the powder in the heating step, this powder agglomerates again eventually, such agglomerates are supplied into the coating step.

Thus, none of the so far proposed techniques have successfully solved the problems associated with the apparatus or method for providing coatings on the particles in the powder of the fine core particles or the core particles comprising mainly the fine particles. In actual cases, the particles in the powder of the fine core particles or the core particles comprising mainly the fine particles form agglomerates which cannot be disintegrated and, hence, no methods or apparatus have been known for producing coated particles in which the particles, being dispersed as single particles, are covered on their surfaces.

Thus, methods and apparatus for producing the coated particles in which the particles in the powder of fine core particles, for example, the fine particles not larger than 10 $\mu$m or the particles in the powder of core particles comprising mainly the fine particles can be actually coated on a single particle basis with the coat forming substances are strongly desired.

DISCLOSURE OF THE INVENTION

An object of the invention is to provide a process for producing coated particles in which the particles in a powder of fine core particles or core particles comprising mainly fine particles are coated on a single particle basis with a coat forming substance and an apparatus for producing coated particles.

In order to solve the above-described problems, the present inventors conducted intensive studies and found the following: in order to insure that the particles in a powder of core particles which comprise the particles in the powder of the fine core particles or the core particles comprising mainly the fine particles are coated, on a single particle basis, with coat forming substances, a mixture of a gas with a powder of highly dispersed core particles in which the particles in the powder of core particles having an average diameter of no more than 10 $\mu$m in the frequency distribution by volume are present in a gaseous atmosphere mainly in a single-particle state must be introduced into the coating start region of a coating space while the particles are in a highly dispersed state such that the dispersity β is at least 70% and then a coating operation must be started on those particles.

Stated more specifically, the present invention has been accomplished on the basis of the finding of the following two facts: (I) In a mixture of a gas with a powder of highly dispersed core particles in which the particles in said powder of core particles are present in a gaseous atmosphere mainly in a single-particle state, those dispersed particles have a tendency to reagglomerate with the passage of time, due to Brownian agglomeration, turbulent agglomeration, sonic agglomeration and the like, even if they are not allowed to stay within a certain area and once they have formed reagglomerates, it is difficult to disintegrate the reagglomerates and to redisperse the reagglomerates unless they are dispersed by a dispersing means having especially high dispersing performance and, to this end, the particles in the powder of the core particles in the mixture of the gas with the powder of highly dispersed core particles in which the particles in the powder of core particles having an average diameter of no more than 10 $\mu$m in the frequency distribution by volume are present in the gaseous atmosphere mainly in a single-particle state have to be introduced into the coating start region of a coating space while the particles are in a highly dispersed state such that the dispersity β is at least 70%; and to this end, (II) it is necessary to employ a group of one or more dispersing means that have especially high dispersing performance such that the agglomerates composed of the powder of those core particles can be disintegrated and dispersed in highly dispersed state the particles in the powder of the core particles in the mixture of the gas with the powder of the highly dispersed core particles in which the particles in the powder of core particles are present in the gaseous atmosphere mainly in a single-particle state.

Namely, according to the present invention, there is provided a process for producing coated particles comprising the step of:

charging a powder of core particles into a coating space; and then permitting a precursor of a coat forming substance which is generated via the vapor phase and/or a precursor of a coat forming substance in a vapor-phase state to contact and/or impinge against the particles in said powder of core particles so that their surfaces are coated with the coat forming substance;

wherein said process for producing the coated particles further comprises:

(A) a dispersing step in which the particles in the powder of fine core particles or core particles comprising mainly fine particles, in which the fine core particles or fine particles have an average diameter no more than 10 $\mu$m in the frequency distribution by volume are dispersed by a group of means for high dispersion treatment of fine particles in a gaseous atmosphere to form a mixture of a gas and the particles in a powder of highly dispersed particles, the final treating means in said group of means for high dispersion treatment of fine particles being selected from between:

(a) dispersing means for dispersing the particles in the powder of core particles in a gaseous atmosphere; and (b) means for selecting a mixture of a gas and the particles in a powder of highly dispersed particles which comprises:

means for selecting a mixture of a gas and the particles in a powder of highly dispersed particles that separates a portion of the powder that is composed of less highly dispersed particles from the mixture of a gas and the particles in the powder of core particles in which the particles in the powder of core particles are dispersed in a gaseous atmosphere, thereby selecting a mixture of a gas and the particles in a powder of highly dispersed core particles in which the particles in the powder of core particles are present in the gaseous atmosphere mainly in a single-particle state; and feedback means by which the portion of the powder that is composed of less highly dispersed particles and which has been separated by said means for selecting a mixture of a gas and the particles in a powder of highly dispersed particles is transported to the final dispersing means among the dispersing means in the group of means for high dispersion treatment of fine particles and/or treating means upstream of the final dispersing means; and (B) a coating step in which the particles in the powder of core particles that have been dispersed in the dispersing step (A) start to be coated by being allowed to contact and/or impinge against the precursor of the coat forming substance in the coating start region of the coating space as they are dispersed to satisfy such that the dispersity β is at least 70%.

Further, the present invention relates to a process for producing coated particles wherein, in the above-described process for producing coated particles, the dispersing step is performed by a group of means for high dispersion treatment of fine particles that has such dispersing performance that a powder of core particles having an average diameter of no more than 10 $\mu$m in the frequency distribution by volume is dispersed in a gaseous atmosphere by the final treatment by said group of means for high dispersion treatment of fine particles, thereby forming a mixture of a gas and the particles in the powder of highly dispersed core particles and that the dispersity β of the particles in said powder of core particles is adjusted to at least 70%; and wherein said process further comprises a transporting step in which the mixture of a gas and the particles in the powder of highly dispersed core particles as formed by one of the means in said group of means for high dispersion treatment of fine particles is discharged directly to the coating step; or transported to a portion between the dispersing and coating steps from a discharge section that discharges said mixture of a gas and the particles in the powder of highly dispersed core particles as formed by one of the means in said group of means for high dispersion treatment of fine particles via at least one member indispensable to transport that is selected from the group consisting of a hollow member, an intermediate member composed of a member that forms a hollow portion, and a pipe; and/or transported via at least one means selected from the group consisting of means for maintaining the dispersion in a gaseous atmosphere of the highly dispersed core particles in the mixture of a gas with the core particles which have been dispersed in the gaseous atmosphere to attain one of the dispersities set forth above, means for enhancing the dispersion in a gaseous atmosphere of the highly dispersed core particles in the mixture of a gas with the core particles which have been dispersed in the gaseous atmosphere to attain one of the dispersities set forth above, and means for separating a mixture of a gas and the particles in a powder of less highly dispersed core particles from said gas-particle mixture so as to select a mixture of a gas and the particles in a powder of highly dispersed core particles in which the core particles are present in the gaseous atmosphere mainly in a single-particle state.

Still further, the present invention relates to a process for producing coated particles, wherein at least one part of the dispersing step which is performed by a group of means for high dispersion treatment of fine particles that has such dispersing performance that a powder of core particles having an average diameter of no more than 10 $\mu$m in the frequency distribution by volume is dispersed in a gaseous atmosphere by the final treatment by said group of means for high dispersion treatment of fine particles, thereby forming a mixture of a gas and the particles in the powder of highly dispersed core particles and that the dispersity β of the particles in said powder of core particles is adjusted to at least 70% and at least one part of the coating step are performed in such a way that the former shares one or more parts of the space with the latter.

Moreover, the present invention relates to a process for producing coated particles, wherein, in the above-described process for producing coated particles, the coating start region of the coating space is located in either one of the following space regions that includes planes through which all particles in the powder of highly dispersed core particles as mixed with a gas will pass a space region in which a powder of core particles that have an average diameter of no more than 10 $\mu$m in the frequency distribution by volume is dispersed in a gaseous atmosphere by the final treatment by said group of means for high dispersion treatment of fine particles, thereby forming a mixture of a gas and the particles in the powder of highly dispersed core particles and that the dispersity β of the particles in said powder of core particles is adjusted to at least 70%; or wherein the coating start region of the coating space is located in either one of the following space regions that includes planes through which all particles to be recovered into the recovery section of the recovery means will pass a space region in which a powder of core particles that have an average diameter of no more than 10 $\mu$m in the frequency distribution by volume is dispersed in a gaseous atmosphere by the final treatment by said group of means for high dispersion treatment of fine particles, thereby forming a mixture of a gas and the particles in the powder of highly dispersed core particles and that the dispersity β of the particles in said powder of core particles is adjusted to at least 70%.

Still more, the present invention relates to a process for producing coated particles, wherein in the above-described process for producing coated particles, the particles in the powder of core particles have a size distribution of $((D_M/5, 5D_M), \geqq 90\%)$ in terms of frequency distribution by volume, where $D_M$ represents the average particle diameter.

Further, according to the present invention, there is provided an apparatus for producing coated particles, in the apparatus for carrying out the above-described process for producing the coated particles, that is, the apparatus for producing the coated particles by charging a powder of core particles into a coating space; and then permitting a precursor of a coat forming substance which is generated via the vapor phase and/or a precursor of a coat forming substance in a vapor-phase state to contact and/or impinge against the particles in said powder of core particles so that their surfaces are coated with the coat forming substance;

wherein said apparatus for producing the coated particles further comprises:

(A) means for dispersion treatment in which the particles in the powder of fine core particles or core particles comprising mainly fine particles, in which the fine core particles or fine particles have an average diameter no more than 10 μm in the frequency distribution by volume are dispersed by a group of means for high dispersion treatment of fine particles in a gaseous atmosphere to form a mixture of a gas and the particles in a powder of highly dispersed particles, the final treating means in said group of means for high dispersion treatment of fine particles being selected from between:

(a) dispersing means for dispersing the particles in the powder of core particles in a gaseous atmosphere; and (b) means for selecting a mixture of a gas and the particles in a powder of highly dispersed particles which comprises:

means for selecting a mixture of a gas and the particles in a powder of highly dispersed particles that separates a portion of the powder that is composed of less highly dispersed particles from the mixture of a gas and the particles in the powder of core particles in which the particles in the powder of core particles are dispersed in a gaseous atmosphere, thereby selecting a mixture of a gas and the particles in a powder of highly dispersed core particles in which the particles in the powder of core particles are present in the gaseous atmosphere mainly in a single-particle state; and feedback means by which the portion of the powder that is composed of less highly dispersed particles and which has been separated by said means for selecting a mixture of a gas and the particles in a powder of highly dispersed particles is transported to the final dispersing means among the dispersing means in the group of means for high dispersion treatment of fine particles and/or treating means upstream of the final dispersing means; and (B) a coating chamber in which the particles in the powder of core particles that have been dispersed in means for dispersion treatment (A) start to be coated by being allowed to contact and/or impinge against the precursor of the coat forming substance in the coating start region of the coating space as they are dispersed to satisfy such that the dispersity β is at least 70%.

Further, the present invention relates to an apparatus for producing coated particles, wherein, in the above-described apparatus for producing coated particles, means for dispersion treatment is performed by a group of means for high dispersion treatment of fine particles that has such dispersing performance that a powder of core particles having an average diameter of no more than 10 μm in the frequency distribution by volume is dispersed in a gaseous atmosphere by the final treatment by said group of means for high dispersion treatment of fine particles, thereby forming a mixture of a gas and the particles in the powder of highly dispersed core particles and that the dispersity β of the particles in said powder of core particles is adjusted to at least 70%; and wherein a discharge section in the group of means for high dispersion treatment of fine particles that discharge from the group of means for highly dispersion treatment of fine particles the mixture of the gas and the particles in the powder of highly dispersed core particles which is allowed to disperse by means for the final treatment in the group of means for high dispersion treatment of fine particles is connected directly to a coating chamber having a coating space in the apparatus for producing coated particles; or connected thereto via at least one member indispensable to transport that is selected from the group consisting of a hollow member, an intermediate member composed of a member that forms a hollow portion, and a pipe; and/or connected thereto via at least one means selected from the group consisting of means for maintaining the dispersion in a gaseous atmosphere of the highly dispersed core particles in the mixture of a gas with the core particles which have been dispersed in the gaseous atmosphere to attain one of the dispersities set forth above, means for enhancing the dispersion in a gaseous atmosphere of the highly dispersed core particles in the mixture of a gas with the core particles which have been dispersed in the gaseous atmosphere to attain one of the dispersities set forth above, and means for separating a mixture of a gas and the particles in a powder of less highly dispersed core particles from said gas-particle mixture so as to select a mixture of a gas and the particles in a powder of highly dispersed core particles in which the core particles are present in the gaseous atmosphere mainly in a single-particle state.

Still further, the present invention relates to an apparatus for producing coated particles, wherein, in the above-described apparatus for producing coated particles, at least one part of means for dispersion treatment including the group of means for high dispersion treatment of fine particles that has such dispersing performance that a powder of core particles having an average diameter of no more than 10 μm in the frequency distribution by volume is dispersed in a gaseous atmosphere by the final treatment by said group of means for high dispersion treatment of fine particles, thereby forming a mixture of a gas and the particles in the powder of highly dispersed core particles and that the dispersity β of the particles in said powder of core particles is adjusted to at least 70%, and said coating chamber are provided in such a way that at least one part of means for dispersion treatment shares one or more parts of the space that these occupy with the coating chamber.

Moreover, the present invention relates to an apparatus for producing coated particles, wherein, in the above-described apparatus for producing coated particles, the coating start region of the coating space is located in either one of the following space regions that include planes through which all particles in the powder of highly dispersed core particles as mixed with a gas will pass a space region in which a powder of core particles that have an average diameter of no more than 10 μm in the frequency distribution by volume is dispersed in a gaseous atmosphere by the final treatment by said group of means for high dispersion treatment of fine particles, thereby forming a mixture of a gas and the particles in the powder of highly dispersed core particles and that the dispersity β of the particles in said powder of core particles is adjusted to at least 70%; or wherein the coating start region of the coating space is located in either one of the following space regions that includes planes through which all particles to be recovered into the recovery section of the recovery means will pass a space region in which a powder of core particles that have an average diameter of no more than 10 μm in the frequency distribution by volume is dispersed in a gaseous atmosphere by the final treatment by said group of means for high dispersion treatment of fine particles, thereby forming a mixture of a gas and the particles in the powder of highly dispersed core particles and that the dispersity β of the particles in said powder of core particles is adjusted to at least 70%.

Still more, the present invention relates to an apparatus producing coated particles, wherein, in the above-described apparatus for producing coated particles, the particles in the powder of core particles have a size distribution of (($D_M$/5, 5$D_M$), ≧90%) in terms of frequency distribution by volume, where DM represents the average particle diameter.

Thus, in accordance with the present invention, a precursor for the coat forming substance that has just formed via the vapor phase by a vapor-phase process and/or a precursor for the coat forming substance in a vapor-phase state and a mixture of a gas with a powder of highly dispersed core particles that have been dispersed in a gaseous atmosphere by the final treating means in a group of means for high dispersion treatment of fine particles are allowed to combine with each other in the coating start region of a coating space while the particles in the mixture of a gas and the powder of highly dispersed core particles are in a dispersed state such that the dispersity β is at least 70%, whereupon the precursor and the mixture are allowed to contact and/or impinge against each other so that the surfaces of the particles in the powder of the core particles are coated with the coat forming substance. In this case, the precursor for the coat forming substance has just formed via the vapor phase as comprised of atoms, molecules, ions, clusters, atomic clusters, molecular clusters, cluster ions, etc. and, in short, the precursor itself is in a nascent state and in a greatly active state; having started to contact and/or impinge against this core particles in the highly dispersed state, the coat forming substance binds firmly to the surfaces of the individual core particles in the state of primary particles, thereby being able to yield coated particles in which those core particles in powder form are covered with the coat forming substance on a single particle basis.

BEST MODE FOR CARRYING OUT THE INVENTION

Figure 1A:
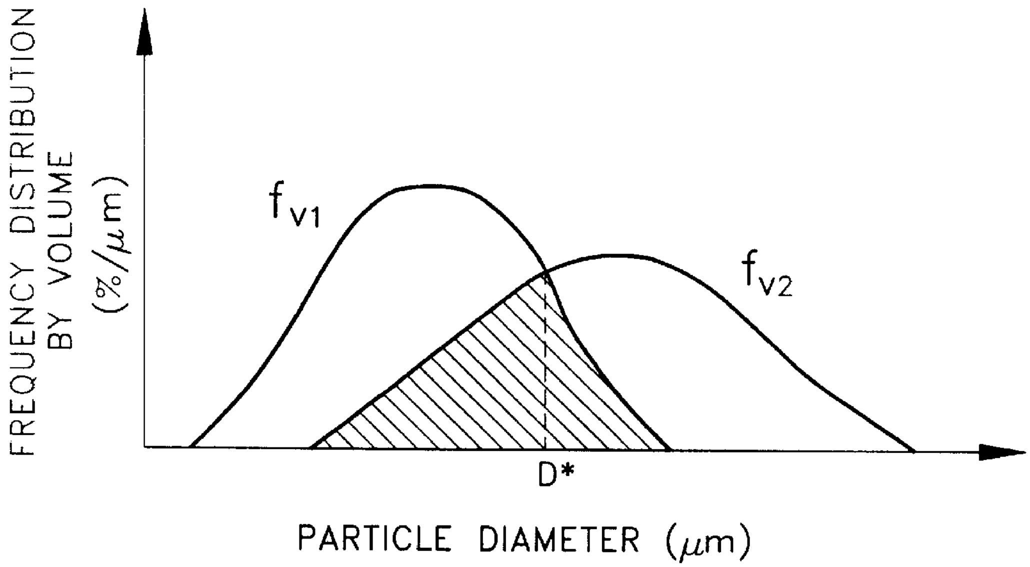
FIG. 1*a* is a diagram showing the original dispersity β of particles in a powder.

Before the present invention is described below in detail, let us define the various terms, phrases and expressions that are used herein, and describe, if necessary, the specific implications of those terms, phrases and expressions.

Coated Particles

The term "coated particles" refers to the particles which are provided with coats. To give one specific example, the terms refer to those coated particles in which core particles are provided with the coats of said coat forming substances in the form of at least one type selected from among ultrafine particles, islands, continuous phase, uniform membranes, projections, etc.

Vapor-Phase Coating Method

The term "vapor-phase coating method" means a method in which coating is applied with the feed of a coat forming substance being passed at least once through a vapor-phase state that consists of at least one member selected from among a molecular stream under vacuum, an ionic stream, a plasma, a gas, a vapor and an aerosol; alternatively, the term refers to a method in which coating is applied from the feed of a coat forming substance in either one of the vapor-phase states mentioned above.

Core Particles

The term "core particles" refers to those particles which are to be provided with coatings. Such particles may sometimes be referred to as "base particles", "seed particles" or "particles to be coated".

The substances composing this core particles are not limited basically in to any particular substances and well known particles of the powder composed of, for example, inorganic materials, metallic materials, organic materials and the like can be used as the core particles.

Powder of Core Particles

The term "powder of core particles" means a powder consisting of core particles. The phrase "the particles in a powder of core particles" refers to those particles which compose the powder of core particles. The particles in the powder of fine core particles or core particles comprising mainly fine particles to be coated which are used in the present invention are fine particles the average diameter of which is not more than 10 μm in terms of frequency distribution by volume.

Preferred particles are those which have such a particle size distribution that the average diameter $D_M$ satisfies the relation (($D_M$/5, 5$D_M$), ≧90%) in terms of frequency distribution by volume.

With powders having such comparatively narrow distributions, their dispersion or cohesion characteristics are characterized by average particle diameter and the powders can be dispersed by operating a group of means for high dispersion treatment of particles under conditions that suit the specific value of $D_M$.

With a powder in which the particle size distribution of particles in the powder of core particles is either broad or has a plurality of separate spaced peaks, a suitable selective separation treatment, say, classification may advantageously be performed and the individual classified powder portions are subjected to the coating treatment according to the invention. By so doing, coating can be started on the individual classified powder portions under the above-stated conditions in the coating start region of the coating space with the dispersity β adjusted to at least 70%, whereupon the individual particles in the powder of core particles can be provided with coatings.

Coat Forming Substance

The term "coat forming substance" means a substance that forms a coat on the particles to be coated. This may specifically be exemplified by those substances which provide with coatings in the form of at least one kind selected from among ultrafine particles, islands, continuous phase, uniform membranes, projections, etc.

Particularly in the case where the coat forming substance assumes the form of ultrafine particles, their diameter may range from 0.005 μm to 0.5 μm.

The coat forming substance may be composed of various kinds of inorganic materials, metallic materials or organic materials as same as or different from the core particles in accordance with the desired properties and functions for the coated particles to be obtained. The coat forming substances which can be used may be exemplified by materials composed of oxides such as $Al_2O_3$, $SiO_2$, $ZrO_2$, $Y_2O_3$, CaO, MgO, $MgAl_2O_4$ (spinel), $Al_2SiO_5$ (mullite), etc.; nitrides such as $Si_3N_4$, AlN, TiN, ZrN, $Si_2N_2O$, HfN, $V_xN$ (x=1–3), NbN, TaN, $Ta_2N$, BN, etc.; carbides such as WC, SiC, $W_2C$, HfC, TaC, $Ta_2C$, NbC, $MO_2C$, etc.; borides such as BP, TiB, $TiB_2$, $ZrB_2$, VB, $V_3B_2$, $VB_2$, NbB, $NbB_2$, TaB, $TaB_2$, MoB, $MoB_2$, $MoB_4$, $MO_2B$, WB, $W_2B$, $W_2B_5$, $LaB_6$, $B_{13}P_2$, etc.; elemental metals such as Si, Al, Ni, Co, Cu, Fe, Ti, W, B, Nb, V, Zr, Hf, Ta, Re, Cr, Mo, Y, La, etc.; various kinds of intermetallic compounds and alloys such as TiAl, $Ti_2Al$, $TiAl_3$, TiNi, NiAl, $Ni_3Al$, etc. and composite materials of these materials, and epoxy resin, phenol resin, polyacrylamide resin, polyamide resin, urethane resin, polyester resin, polyvinyl chloride resin, acryl resin, polyetylene, etc.

Definition of "Charging into the Coating Space"

The phrase "charging into the coating space" means introducing the powder of core particles into the coating space by a certain method of falling such as free fall. In the case of charging by means of a carrier gas, the phrase means introducing the powder of core particles as it is carried in the direction of a mixture of a gas and the particles in the powder of core particles, or carried by a gas in the direction of its flow, or carried by a gas to change the direction of flow. Alternatively, the phrase means introduction under the action of a carrier gas, for example, through the wave motion, specifically, a nonlinear wave motion, of the carrier gas. Alternatively, the phrase means introduction into the coating space by sound waves, ultrasonic waves, magnetic fields, electron beams, etc. in the gas. The phrase also means introduction in an applied field such as an electric field, a magnetic field or electron beams. Specifically, the powder particles may be charged or magnetized in an electric field, a magnetic field, by electron beams, etc. and introduced into the coating space by attractive or repulsive forces. Also contemplated by the phrase is introduction by aspiration under the back pressure of the gas or in vacuo.

Coating Space

The term "coating space" refers to a space in which the precursor of the coat forming substance which is generated from the feed of the coat forming substance via the vapor phase and/or the precursor of the coat forming substance in a vapor-phase state contacts and/or impinges against the particles in the powder of core particles. Alternatively, the term refers to a space region in which the surfaces of the particles in the powder of core particles are coated with the coat forming substance.

Coating Chamber

The term "coating chamber" means a compartment having the coating space in at least one part. More specifically, the coating chamber is a partitioned or generally partitioned (generally closed or semi-closed) compartment including the coating space and it is a compartment including the coating space in at least one part.

Within Gaseous Atmosphere

The expression "within a gaseous atmosphere" means within a space under vacuum or in a vapor-phase state. The term "vapor-phase state" as used herein means various states such as a molecular stream, an ionic stream, a plasma, a gas and a vapor. Technically speaking, the term "vacuum" refers to a state under reduced pressure. Strictly speaking, gases, molecules, atoms, ions, etc. are contained at any values of reduced pressure.

Precursor of the Coat Forming Substance

The term "precursor of the coat forming substance" means a precursor for the coat forming substance. More specifically, it refers to the feed per se of the coat forming substance in a vapor-phase state or, alternatively, it means a substance that is formed and/or synthesized from the feed of the coat forming substance via the vapor phase and which exists just before it forms a coating on the core particles to be coated. The precursor of the coat forming substance is not limited to any state as long as it is formed and/or synthesized from the feed of the coat forming substance via the vapor phase somewhere. If the feed of the coat forming substance is in the vapor phase, the feed itself can be used as the precursor of the coat forming substance. The precursor of the coat forming substance may itself be in the vapor phase. It may be prior to, or during or after the reaction. Specific examples of the precursor of the coat forming substance include ions, atoms, molecules, clusters, atomic clusters, molecular clusters, cluster ions, superfine particles, gases, vapors, aerosols, etc.

Feed of the Coat Forming Substance

The term "feed of the coat forming substance" refers to a feed material that passes through the vapor phase to become a coat forming substance. Specific examples of the state in which the feed of the coat forming substance may exist include solid lumps, powder particles, gases, liquids, etc.

Dispersity β

Dispersity β was proposed by Masuda, Gotoh et al. as an index for evaluating the dispersing performance of powder dispersing equipment (see KAGAKU KOGAKU, Summaries of Speeches and Lectures Delivered at the 22th Autumn Conference, p. 349 (1989)) and is defined as the proportion of the weight of particles in the state of apparent primary particles relative to the total weight of the particles present. The term "particles in the state of apparent primary particles" as used herein refers to the proportion of the overlap between the frequency distribution by mass of powder particles in a given state of dispersion $f_{m2}$ and the frequency distribution by mass of completely dispersed powder particles $f_{ml}$ and is expressed by β according to the following equation:

$$\beta = \int_0^{D_m^*} f_{m2}(D)dD + \int_{D_m^*}^{\infty} f_{m1}(D)dD$$

where D: particle diameter (μm);

$D_m^*$: the particle diameter ($\mu$m) for the point of crossing between $f_{m1}$ and $f_{m2}$;

$f_{m1}$: the frequency distribution by mass (%/$\mu$m) representing the particle size distribution for complete dispersion;

$f_{m2}$: the frequency distribution by mass (%/$\mu$m) representing the particle size distribution of particles in a given state of dispersion; and β: dispersity (%).

In the equation set forth above, the unit of measurement ($\mu$m) of the particle diameter is not limited to any particular value.

This equation evaluates dispersity on the basis of the particle size distribution as expressed by mass; however, dispersity should in principle be evaluated on the basis of the particle size distribution expressed by volume. Given the same density of powder particles, the particle size distribution as expressed by mass is equal to the particle size distribution expressed by volume. Therefore, in practice, the particle size distribution by mass which is easy to measure is determined and used as an equivalent of the particle size distribution by volume. Therefore, the dispersity β in the true sense of the term is expressed by the following equation and the area of the hatched portion shown in FIG. 1*a*:

$$\beta = \int_0^{D_v^*} f_{v2}(D)dD + \int_{D_v^*}^{\infty} f_{v1}(D)dD$$

where D: particle diameter ($\mu$m);

$D_v^*$: the particle diameter ($\mu$m) for the point of crossing between $f_{v1}$ and $f_{v2}$;

$f_{v1}$: the frequency distribution by volume (%/$\mu$m) representing the particle size distribution for complete dispersion;

$f_{v2}$: the frequency distribution by volume (%/$\mu$m) representing the particle size distribution of particles in a given state of dispersion; and β: dispersity (%).

In the equation set forth above, the unit of measurement ($\mu$m) of the particle diameter is not limited to any particular value.

In the following description, the distribution of the particles in the powder of core particles and their average diameter should, in principle, be based on volume unless otherwise noted.

Frequency Distribution by Volume

The frequency distribution by volume represents the distribution of particle diameter in terms of the relative volume of particles in a certain range of diameters.

Definition of ((D1, D2), ≧90%)

Figure 1B:
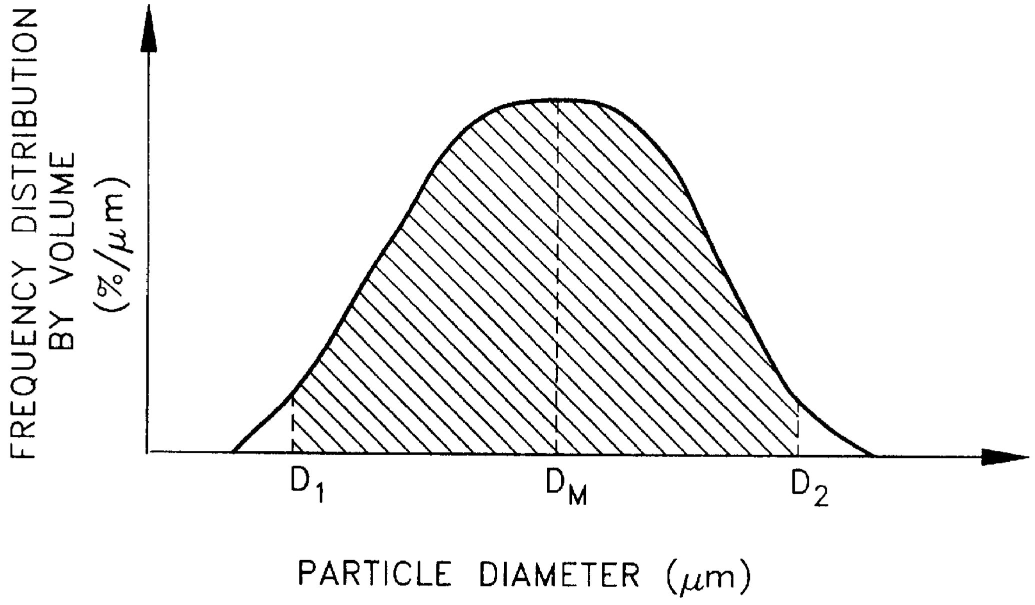
FIG. 1*b* is a diagram showing the frequency by volume vs diameter relationship of a powder 90% of the volume of which is occupied by particles with sizes in the range from $D_1$–$D_2$.

A ((D1, D2), ≧90%) distribution represents one in which particles from D1 to D2 (D1 and D2 each represent the particle diameter, provided that D1<D2) account for at least 90% of the total volume of the particles present; a powder having this distribution is shown graphically in FIG. 1*b*, in which the hatched portion accounts for at least 90% of the area under the curve.

Definition of Frequency Distribution by Volume (($D_M$/5, $5D_M$), ≧90%)

A particle size distribution that is expressed by (($D_M$/5, $5D_M$), ≧90%) in terms of frequency distribution by volume which is used in the present invention represents one in which particles ranging in diameter from one fifth of $D_M$ to five times $D_M$ ($D_M$ is the average particle diameter by volume) account for at least 90% of the total volume of the particles present. Consider, for example, particles having an average diameter $D_M$ of 5 $\mu$m on a volume basis; a particle size distribution that is expressed by (($D_M$/5, $5D_M$), >90%) in terms of frequency distribution by volume represents one in which particles ranging in diameter from 1 $\mu$m to 25 $\mu$m account for at least 90% of the total volume of the particles present. The average particle diameter $D_M$ on a volume basis is expressed by:

$$D_M = \frac{\int_0^{\infty} Df(D)dD}{\int_0^{\infty} f(D)dD}$$

where f(D) is the frequency distribution by volume. Or $D_M$ is technically expressed by:

$$DM = \Sigma(V_i D_i)/\Sigma V_i$$

where Vi is the volume of a group of particles within a given interval of diameters $D_i \pm \Delta D_i/2$ ($\Delta D_i$ is the width of interval).

Coating Start Region

The region where coating is first started after the final treatment by the group of means for high dispersion treatment of fine particles is called the "coating start region". Therefore, prior to the final treatment by the group of means for high dispersion treatment of fine particles, no region is called the "coating start region" according to this definition even if coating is first started there.

Dispersity β in the Coating Start Region

In the present invention, the coating chamber is provided in such a way that the coating start region of the coating space is located in a region that satisfies such that a powder of core particles that have an average diameter of no more than 10 $\mu$m in the frequency distribution by volume should be dispersed in a gaseous atmosphere by the final dispersing treatment by the group of means for high dispersion treatment of fine particles, thereby forming a mixture of a gas and the particles in the powder of highly dispersed core particles and the dispersity β of the particles in said powder of core particles should be adjusted to at least 70%.

Given this dispersity in the coating start region of the coating space, one can disperse the particles in the powder of fine core particles or core particles comprising mainly fine particles which have the average diameter of which is not more than 10 $\mu$m in terms of frequency distribution by volume in a gaseous atmosphere substantially, so that the precursor of the coat forming substance will contact and/or impinge against at least one part of the surfaces of all particles in the powder of core particles that pass through the coating start region of the coating space, whereby the coat forming substance can be deposited on one particle basis necessarily.

Advantageously, in the coating start region of the coating space, a powder of core particles that have an average diameter of no more than 10 $\mu$m in the frequency distribution by volume allow to be dispersed in a gaseous atmosphere by the final dispersing treatment by the group of means for high dispersion treatment of fine particles, thereby forming a mixture of a gas and the particles in the powder of highly dispersed core particles and the dispersity β of the particles in said powder of core particles should be adjusted to at least 80%.

If this dispersity is attained in the coating start region of the coating space, the particles in the powder of core particles are free from areas that are substantially closed by two adjacent core particles against the particles in the powder of fine core particles or core particles comprising mainly fine particles that have an average diameter of no more than 10 μm in the frequency distribution by volume and it is possible to assure that the precursor of the coat forming substance is allowed to contact and/or impinge against the surfaces of individual particles from every direction, whereby coating can be accomplished uniformly.

More advantageously, in the coating start region of the coating space, a powder of core particles that have an average diameter of no more than 10 μm in the frequency distribution by volume should be dispersed in a gaseous atmosphere by the final dispersing treatment by the group of means for high dispersion treatment of fine particles, thereby forming a mixture of a gas and the particles in the powder of highly dispersed core particles and the dispersity β of the particles in said powder of core particles should be adjusted to at least 90%. If this dispersity is attained in the coating start region of the coating space, even though the particles in the powder of core particles is the particles in the powder of fine core particles or core particles comprising mainly fine particles that have an average diameter of no more than 10 μm in the frequency distribution by volume, the particles are practically free from agglomeration and practically uniform coating can be performed on the surfaces of the individual particles. If, in a particular case, high-quality coating is desired at the sacrifice of the efficiency of treatment, the dispersity is preferably at least 95%. In this case, a very small quantity of the particles in the powder of core particles may be treated, the concentration by number of the particles in the powder of core particles in the gaseous atmosphere may be reduced, whereby it can be accomplished.

The particles in the powder of fine core particles or core particles comprising mainly fine particles that have an average diameter of no more than 10 μm in the frequency distribution by volume are extremely easy to agglomerate, the behavior of this powder is different from the behavior of the powder having the average particle size larger than this. However, if the coating of the particles in the powder of core particles is started as they are dispersed to provide the above-specified dispersity, the individual particles in the powder of fine core particles or the particles in the powder of core particles that consist chiefly of the fine particles can be coated with the coat forming substance.

Group of Means for High Dispersion Treatment of Particles

The group of means for high dispersion treatment of fine particles which is to be used in the present invention is such that:

(A) it has at least one dispersing means; and (B) it has, as the final treating means,
  - (a) dispersing means for dispersing the particles in a powder of core particles in a gaseous atmosphere or
  - (b) means for selecting a mixture of a gas and the particles in a powder of highly dispersed particles which comprises
    - means for selecting a mixture of a gas and the particles in a powder of highly dispersed particles that separates a portion of the powder that is composed of less highly dispersed particles from the mixture of a gas and the particles in the powder of core particles in which the particles in the powder of core particles are dispersed in a gaseous atmosphere, thereby selecting a mixture of a gas and the particles in a powder of highly dispersed core particles in which the particles in the powder of core particles are present in the gaseous atmosphere mainly in a single-particle state and
    - feedback means by which the portion of the powder that is composed of less highly dispersed particles and which has been separated by said means for selecting a mixture of a gas and the particles in a powder of highly dispersed particles is transported to the final dispersing means among the dispersing means in said group of means for high dispersion treatment of fine particles and/or treating means upstream of the final dispersing means.

Advantageously, the group of means for high dispersion treatment of fine particles has such dispersing performance that a powder of core particles that have an average diameter of no more than 10 μm in the frequency distribution by volume should be dispersed in a gaseous atmosphere by the final treatment by said group of means for high dispersion treatment of particles, thereby forming a mixture of a gas and the particles in the powder of highly dispersed core particles and the dispersity β of the particles in said powder of core particles should be adjusted to at least 70%.

By insuring that the group of means for high dispersion treatment of fine particles have dispersing capabilities comparable to or better than the various dispersities, for example, $\beta \geqq 70\%$, 80%, 90%, to be attained in the above-described coating start region and by providing them in correspondence to those dispersities, high-quality coating can be applied in the coating start region to comply with the respective dispersities.

Final Treating Means

If the final treating means in the group of means for high dispersion treatment of fine particles is a dispersing means, said dispersing means is referred to as the final treatment means in the group of means for high dispersion treatment of fine particles. If the final treating means in the group of means for high dispersion treatment of fine particles is a means for selecting a mixture of a gas and the particles in a powder of highly dispersed particles which is equipped with a feedback means by which the portion that has been separated selectively on account of less highly dispersed state during the step of treatment for selecting the mixture of a gas and the particles in the powder of highly dispersed core particles is to be transported to the final dispersing means at the last stage of the means for high dispersion treatment of fine particles, or if said final treating means is a means for selecting a mixture of a gas and the particles in a powder of highly dispersed particles which is equipped with a feedback means by which the portion that has been separated selectively on account of less highly dispersed state during the step of treatment for selecting the mixture of a gas and the particles in the powder of highly dispersed core particles is to be transported to a treating means upstream of the final dispersing means, said means for selecting a mixture of a gas and the particles in a powder of highly dispersed core particles is referred to as the final treating means in the group of means for high dispersion treatment of fine particles.

It should be noted here that any means for selecting a mixture of a gas and the particles in a powder of highly dispersed particles that is provided upstream of the means for selecting a mixture of a gas and the particles in a powder of highly dispersed particles that is equipped with a feedback means and which is the final treating means in the group of means for high dispersion treatment of fine particles ("upstream" may typically mean between the means for selecting a mixture of a gas and the particles in a powder of highly dispersed particles that is equipped with this feedback means and the final dispersing means, or upstream of the final dispersing means) is a constituent element of the group of means for high dispersion treatment of particles and this is true irrespective of whether the feedback means is used or not.

Dispersing Means

The means used to disperse is named a dispersing means. Any mechanism that has even a small or slight dispersing effect is usable as a dispersing means and it is used as a dispersing means in the present invention. Consider, for example, a rotary feeder and an injection feeder for pneumatic conveying which are commonly used as supply means ("Funtai Kogaku Binran (A Handbook of Particle Technology)", Ed. by Funtai Kogakukai (Society of Particle Technology), published by Nikkan Kogyo Shinbunsha in 1986, pp. 568 and 571). These apparatus also have a dispersing effect and, hence, they are dispersing means if used as means to achieve dispersion. The dispersion maintaining and promoting means which are to be discussed later are also dispersing means if they are used to achieve dispersion (for increasing β).

The group of means for high dispersion treatment of fine particles is such that it operates on at least one selected mechanism of dispersion, such as dispersing the particles in a powder of core particles by a gas stream which accelerates and/or places them in a velocity gradient, dispersing the particles in a powder of core particles by impingement against a static obstacle and/or an obstacle composed of a rotating body, and dispersing the particles in a powder of core particles by mechanical disagglomeration which consists of a fluidized bed and/or pulsation and/or a rotary drum and/or vibrations and/or scraping.

Specifically, the group of means for high dispersion treatment of fine particles is equipped with at least one selected dispersing means, such as an ejector-type disperser, a Venturi-type disperser, a disperser using a capillary, an agitator, and an obstacle in a gas stream, a disperser using a jet blow, a disperser using a spiral tube and rotating blades, a disperser using rotating pins (Kady mill), a fluidized bed-type disperser, a disperser using pulsation, a disperser using a rotary drum, a disperser using vibrations, a disperser using a vibrating screen and the scraping action of a scraper, an SAEI Gonnel-type disperser, a Chujo-type disperser, a Roller-type disperser, an office-type disperser, a B.M. type disperser, a Timbrell-type disperser, and a Wright-type disperser ("Funtai Kogaku Binran (A Handbook of Particle Technology)", Ed. by Funtai Kogakukai (Society of Particle Technology), published by Nikkan Kogyo Shinbunsha in 1986, p. 430).

Also usable are the dispersers described in official gazettes and exemplified blow: the disperser using agitating blades which is described in Unexamined Published Japanese Patent Application (kokai) Sho 56-1336; the disperser using a high-speed gas stream and dispersing nozzles which is described in Unexamined Published Japanese Patent Application (kokai) Sho 58-163454; the disperser using the dispersing action of rotating blades and the dispersing action of plasma ions which is described in Unexamined Published Japanese Patent Application (kokai) Sho 59-199027; the disperser using the dispersing action of plasma ions which is described in Unexamined Published Japanese Patent Application (kokai) Sho 59-207319; the disperser using an ejector and the dispersing action of plasma ions which is described in Unexamined Published Japanese Patent Application (kokai) Sho 59-216616; the disperser using an ejector and the dispersing action of ion streams which is described in Unexamined Published Japanese Patent Application (kokai) Sho 59-225728; the disperser using the dispersing action of plasma ions which is described in Unexamined Published Japanese Patent Application (kokai) Sho 59-183845; the disperser using the dispersing action of dispersing blades and a pressure gas which is described in Unexamined Published Japanese Patent Application (kokai) Sho 63-166421; the disperser using lineal or annular slit jet ports which is described in Unexamined Published Japanese Patent Application (kokai) Sho 62-176527; the disperser using mesh blades which is described in Unexamined Published Japanese Patent Application (kokai) Sho 63-221829; the disperser using the dispersing action of high-speed gas streams issuing from jet nozzles which is described in Unexamined Published Japanese Patent Application (kokai) Sho 63-1629; the disperser using many small holes which is described in Unexamined Published Utility Model Application (kokai) Sho 63-9218; the ejector-type disperser which is described in Unexamined Published Japanese Utility Model Application (kokai) Sho 62-156854; and the disperser using small holes and orifices which is described in Unexamined Published Japanese Utility Model Application (kokai) Sho 63-6034.

Dispersing means advantageous for use in the group of means for high dispersion treatment of fine particles include the apparatus that are described in Japanese Patent Application Sho 63-311358, Japanese Patent Application Hei 1-71071, Japanese Patent Application Hei 2-218537, etc.

Means for Selecting a Mixture of a Gas and the Particles in a Powder of Highly Dispersed Core Particles This is a means that separates a mixture of a gas and the particles in a powder of less highly dispersed core particles except a mixture of a gas and the particles in a powder of highly dispersed core particles that is chiefly composed of those particles which are in a single-particle state from the mixture of a gas and the particles in the powder of core particles so as to select the mixture of the gas and the particles in the powder of highly dispersed core particles that is chiefly composed of those particles which are in a single-particle state. Agglomerating particles which are association of primary particles have a greater apparent diameter than the primary particles and, hence, they can be separated by a suitable means such as dry classifying means. An example of the means for selecting a mixture of a gas and the particles in a powder of highly dispersed core particles is at least one dry classifying means selected from among the following: classifying means using gravity, classifying means using inertia force, classifying means using centrifugal force, classifying means using static electricity, classifying means using a fluidized bed, etc.

Specific examples of the means for selecting the mixture of a gas and the particles in a powder of highly dispersed core particles include: a gravity classifier, an inertia classifier, a centrifugal classifier, a cyclone, an air separator, a micron separator, a microplex, a multiplex, a zigzag classifier, an acu-cut, a conical separator, a turbo classifier, a super separator, a dispersion separator, an elbow jet, a fluidized bed classifier, a virtual impactor, an O-Sepa, a sieve, a vibrating screen, a sifter ["Funtai Kogaku Binran (A Handbook of Particle Technology)", Ed. by Funtai Kogakukai (Society of Particle Technology), published by Nikkan Kogyo Shinbunsha in 1986, p. 514].

Mixture of a Gas and the Particles in a Powder of Core Particles

The mixture of a gas and the particles in a powder of core particles refers to (a) a homogeneous flow characterized in that the particles in a powder of core particles are suspended uniformly in a gaseous atmosphere (which may be called a "uniform suspension flow"), (b) a heterogeneous flow characterized in that the particles in a powder of core particles show a nonuniform distribution in certain regions of a gaseous atmosphere (which may be called an "inhomogeneous suspension flow"), (c) a flow involving a sliding layer of the particles in a powder of core particles (which may be called a "sliding flow"), or (d) a flow involving a stationary layer of the particles in a powder of core particles.

Mixture of a Gas and the Particles in a Powder of Less Highly Dispersed Core Particles This refers to that portion of a mixture of a gas and the particles in a powder of core particles in which the powder particles are present in a gaseous atmosphere mainly in states other than the single-particle state.

Mixture of a Gas and the Particles in a Powder of Highly Dispersed Core Particles This refers to a mixture of a gas and the particles in a powder of core particles in which the powder particles are present in a gaseous atmosphere mainly in a single-particle state. No matter how much high the degree of dispersion is, the mixture of a gas and the particles in a powder of highly dispersed core particles contains agglomerating particles in practice. The mixture of a gas and the particles in a powder of less highly dispersed particles contains non-agglomerating single particles in practice and can be selectively separated into a mixture of a gas and the particles in a powder of less highly dispersed particles and a mixture of a gas and the particles in a powder of highly dispersed particles. The mixture of a gas and the particles in a powder of less highly dispersed particles is converted to a mixture of a gas and the particles in a powder of highly dispersed particles by selective separation and/or redispersion of the agglomerating particles.

Recovery Means

The recovery means is a means for picking up the coated particles that have been prepared in the coating space. The part of the recovery means in which the recovery treatment is performed is called the "recovery section". The coated particles the coating on which has been provided by passage through the coating start region of the coating space are recovered by direct pickup from the gaseous atmosphere or after temporary storage following pickup from the gaseous atmosphere or together with a gas.

Usable as the recovery section of the recovery means is one of the following members: the recovery section of the recovery means that uses barriers (obstacles), the recovery section of the recovery means that uses gravity, the recovery section of the recovery means that uses inertia forces, the recovery section of the recovery means that uses centrifugal forces, the recovery section of the recovery means that uses coulombic attractive forces; the recovery section of the recovery means that uses thermophoretic forces, the recovery section of the recovery means that uses Brownian diffusion, the recovery section of the recovery means that uses the pulling force of the back pressure, evacuation, etc.

Advantageous examples of the recovery section of the recovery means include a gravity dust collector, an inertia dust collector, a centrifugal dust collector, a filtration dust collector, an electrostatic precipitator, a scrubbing dust collector, a particle packed layer, a cyclone, a bag filter, a ceramic filter, a scrubber, etc.

Figure 2A:
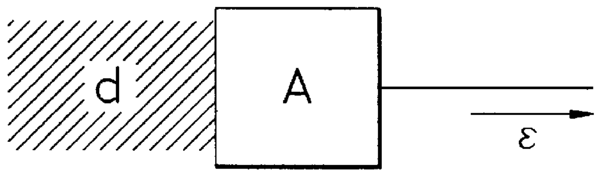
FIGS. 2*a*, 2*b* and 2*c* are block diagrams showing three basic arrangements of means for high dispersion treatment of fine particles, respectively.

Description of the Drawings of the Group of Means for High Dispersion Treatment of Fine Particles FIG. 2*a* is a block diagram showing an example of the basic composition of the group of means for high dispersion treatment of fine particles of the present invention. The group is composed of a final dispersing means A for dispersing the particles in a powder of core particles and a constituent element d of the group of means for dispersion treatment which is upstream of the final dispersing means. Shown by $\epsilon$ is a mixture of a gas and the particles in a powder of highly dispersed core particles which are part of the particles in the powder of core particles and which are present in a gaseous atmosphere mainly in a single-particle state. Constituent element d may be any treating means such as dispersing means, supply means, and means for selecting a mixture of a gas and the particles in a powder of highly dispersed core particles, which may be used either individually or in combination. Constituent element d is optional and may be omitted. The group of means for high dispersion treatment of fine particles is advantageously of such a design that after treatment by the treating means A that is the final treating means, the dispersity can be realized with the dispersity $\beta$ at least 70% for a powder of core particles that have an average diameter of no more than 10 $\mu$m in the frequency distribution by volume.

Figure 2B:
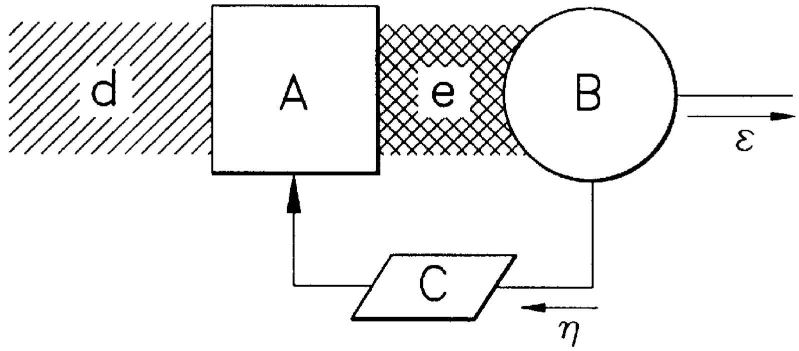

FIG. 2*b* is a block diagram showing one other example of the basic composition of the group of means for high dispersion treatment of fine particles of the present invention. The group is composed of a final dispersing means A for dispersing the particles in a powder of core particles, final means B for selecting a mixture of a gas and the particles in a powder of highly dispersed core particles at the last stage which is equipped with feedback means C by which a mixture of a gas and the particles in a powder of less highly dispersed core particles $\eta$ as separated from a mixture of a gas and the particles in a powder of highly dispersed core particles in which the powder particles are present in a gaseous atmosphere mainly in a single-particle state is fed back to the final dispersing means A, a constituent element d of the group of means for dispersion treatment which is upstream of the final dispersing means, and a constituent element e of the group of means for high dispersion treatment of fine particles which is provided between the final dispersing means and the final selecting means. Shown by $\epsilon$ is a mixture of a gas and the particles in a powder of highly dispersed core particles which are part of the particles in the powder of core particles and which are present in a gaseous atmosphere mainly in a single-particle state. Constituent element d may be any treating means such as dispersing means, supply means, and selecting means, which may be used either individually or in combination. Constituent element e may be any treating means other than the dispersing means, such as supply means and selecting means, which may be used either individually or in combination. Constituent elements d and e are optional and may be omitted. The group of means for high dispersion treatment of fine particles is advantageously of such a design that after treatment by selecting means B which is the final treating means, the dispersity with at least 70% by dispersity $\beta$ can be realized for powders of core particles having the above-mentioned distribution.

Figure 2C:
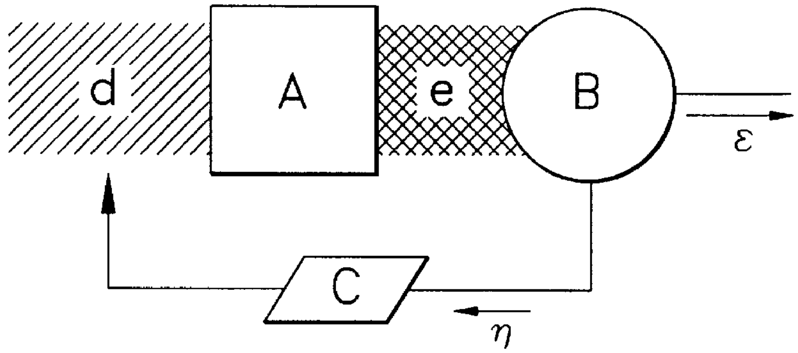

FIG. 2*c* is a block diagram showing one other example of the basic composition of the group for high dispersion treatment of fine particles of the present invention. The group is composed of a final dispersing means A for dispersing the particles in a powder of core particles, final means B for selecting a mixture of a gas and the particles in a powder of highly dispersed core particles at the last stage which is equipped with feedback means C by which a mixture of a gas and the particles in a powder of less highly dispersed core particles $\eta$ as separated from a mixture of a gas and the particles in a powder of highly dispersed core particles in which the powder particles are present in a gaseous atmosphere mainly in a single-particle state is fed back to a treating means upstream of the final dispersing means A, a constituent element d of the group of means for high dispersion treatment of fine particles which is upstream of the final dispersing means, and a constituent element e of the group of means for high dispersion treatment of fine particles which is provided between the final dispersing means and the final selecting means. Shown by ϵ is a mixture of a gas and the particles in a powder of highly dispersed core particles which are part of the particles in the powder of core particles and which are present in a gaseous atmosphere mainly in a single-particle state. Constituent element d may be any treating means such as dispersing means, supply means, and selecting means, which may be used either individually or in combination. Constituent element d may be any treating means other than the dispersing means, such as supply means and selecting means, which may be used either individually or in combination. Constituent elements d and e are optional and may be omitted. The group of means for high dispersion treatment of fine particles is advantageously of such a design that after treatment by selecting means B which is the final treating means, the dispersity with at least 70% by dispersity β can be realized for powders of core particles having the above-mentioned distribution.

Having the construction described above, the group of means for high dispersion treatment of fine particles under discussion may include powder supply sources such as a supply vessel and core particle generating means. To take the case of FIG. 2*c* as an example, the group of means for high dispersion treatment may of course adopt such a composition that the mixture is fed back to a supply vessel by the feedback means C. It also goes without saying that the step of dispersion by the group of means for high dispersion treatment of fine particles may be preceded by a disintegrating step in which the particles in the powder of core particles are disintegrated and/or otherwise reduced in size.

The above-described basic compositions of the group of means for high dispersion treatment of fine particles are described below in greater detail with reference to more detailed block diagrams.

Design 1

Figure 3A:
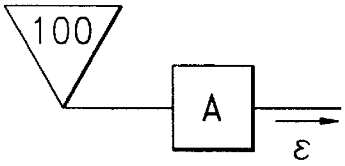
FIGS. 3*a*, 3*b*, 3*c*, 3*d*, 3*e*, 3*f*, and 3*g* are block diagrams showing in greater detail the arrangements of means for high dispersion treatment of fine particles, respectively.

FIG. 3*a* is a block diagram illustrating a first specific design of the group of means for high dispersion treatment of fine particles of the present invention and the drawing corresponds to FIG. 2*a*. The group shown in FIG. 3*a* is composed of a supply vessel 100 for supplying the powder of core particles to be coated, and the final dispersing means A for dispersing the powder of core particles to be coated. Shown by ϵ is a mixture of a gas and the particles in a powder of highly dispersed core particles which are part of the particles in the powder of core particles and which are present in a gaseous atmosphere mainly in a single-particle state Design 2

Figure 3B:
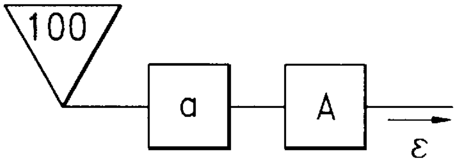

FIG. 3*b* is a block diagram illustrating a second specific design of the group of means for high dispersion treatment of fine particles of the present invention and the drawing corresponds to FIG. 2*a*. The group shown in FIG. 3*b* is composed of a supply vessel 100 for supplying the powder of core particles to be coated, dispersing means a for dispersing the powder of core particles to be coated, and the final dispersing means A for dispersing the powder of core particles to be coated. Shown by ϵ is a mixture of a gas and the particles in a powder of highly dispersed core particles which are part of the particles in the powder of core particles and which are present in a gaseous atmosphere mainly in a single-particle state.

Design 3

Figure 3C:
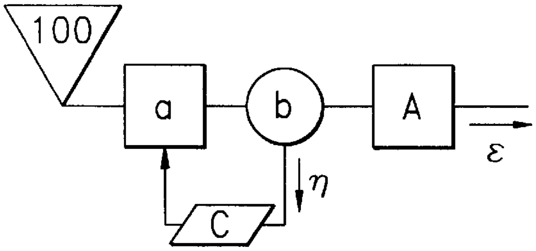

FIG. 3*c* is a block diagram illustrating a third specific design of the group of means for high dispersion treatment of fine particles of the present invention and the drawing corresponds to FIG. 2*a*. The group shown in FIG. 3*c* is composed of a supply vessel 100 for supplying the powder of core particles to be coated, dispersing means a for dispersing the powder of core particles to be coated, feedback means C by which a mixture of a gas and the particles in a powder of less highly dispersed core particles η as separated from a mixture of a gas and the particles in a powder of highly dispersed core particles in which the powder particles are present in a gaseous atmosphere mainly in a single-particle state is fed back from the mixture of a gas and the particles in the powder of core particles (which have been dispersed by the dispersing means a) to the dispersing means a, means b for selecting the mixture of a gas and the particles in a powder of highly dispersed particles, by which the mixture of a gas and the particles in a powder chiefly composed of highly dispersed core particles is introduced into the final dispersing means A, and the final dispersing means A for dispersing the powder of core particles to be coated. Shown by ϵ is a mixture of a gas and the particles in a powder of highly dispersed core particles which are part of the particles in the powder of core particles and which are present in a gaseous atmosphere mainly in a single-particle state.

Design 4

Figure 3D:
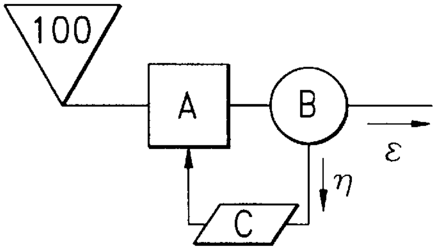

FIG. 3*d* is a block diagram illustrating a fourth specific design of the group of means for high dispersion treatment of fine particles of the present invention and the drawing in FIG. 3*d* corresponds to FIG. 2*b*. The group shown in FIG. 3*d* is composed of a supply vessel 100 for supplying the powder of core particles to be coated, a final dispersing means A for dispersing the powder of core particles to be coated, feedback means C by which a mixture of a gas and the particles in a powder of less highly dispersed core particles η as separated from a mixture of a gas and the particles in a powder of highly dispersed particles in which the powder particles are present in a gaseous atmosphere mainly in a single-particle state is fed back from the mixture of a gas and the particles in the powder of core particles (which have been dispersed by the final dispersing means A) to the dispersing means A, and final means B for selecting the mixture of a gas and the particles in the powder of highly dispersed core particles at the final stage and which discharges the mixture of a gas and the particles in the powder of highly dispersed core particles. Shown by ϵ is a mixture of a gas and the particles in a powder of highly dispersed core particles which are part of the particles in the powder of core particles and which are present in a gaseous atmosphere mainly in a single-particle state.

Design 5

Figure 3E:
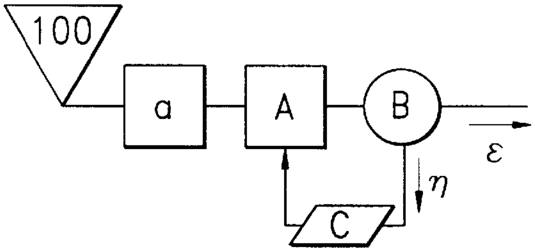

FIG. 3*e* is a block diagram illustrating a fifth specific design of the group of means for high dispersion treatment of fine particles of the present invention and the drawing corresponds to FIG. 2*b*. The group shown in FIG. 3*e* is composed of a supply vessel 100 for supplying the powder of core particles to be coated, dispersing means a for dispersing the powder of core particles to be coated, a final dispersing means A for dispersing the powder of core particles to be coated, feedback means C by which a mixture of a gas and the particles in a powder of less highly dispersed core particles η as separated from a mixture of a gas and the particles in a powder of highly dispersed particles in which the powder particles are present in a gaseous atmosphere mainly in a single-particle state is fed back from the mixture of a gas and the particles in the powder of core particles (which have been dispersed by the final dispersing means A) to the dispersing means A, and final means B for selecting the mixture of a gas and the particles in the powder of highly dispersed core particles at the final stage and which discharges the mixture of a gas and the particles in the powder of highly dispersed core particles. Shown by ϵ is a mixture of a gas and the particles in a powder of highly dispersed core particles which are part of the particles in the powder of core particles and which are present in a gaseous atmosphere mainly in a single-particle state.

Design 6

Figure 3F:
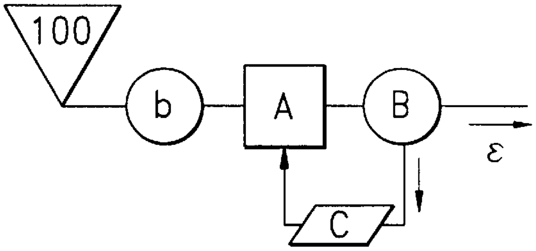

FIG. 3*f* is a block diagram illustrating a sixth specific design of the group of means for high dispersion treatment of fine particles of the present invention and the drawing corresponds to FIG. 2*b*. The group shown in FIG. 3*f* is composed of a supply vessel 100 for supplying the powder of core particles to be coated, means b for selecting a mixture of a gas and the particles in a powder of highly dispersed core particles, which rejects a mixture of a gas and the particles in a powder chiefly composed of less highly dispersed core particles from the mixture of a gas and the particles in the powder of core particles and which introduces into dispersing means A the mixture of a gas and the particles in a powder chiefly composed of highly dispersed core particles, final dispersing means A for dispersing the particles in the selectively separated powder of core particles, feedback means O by which a mixture of a gas and the particles in a powder of less highly dispersed core particles as separated from a mixture of a gas and the particles in a powder of highly dispersed particles in which the powder particles are present in a gaseous atmosphere mainly in a single-particle state is fed back from the mixture of a gas and the particles in the powder of core particles (which have been dispersed by the final dispersing means A) to the dispersing means A, and final means B for selecting the mixture of a gas and the particles in the powder of highly dispersed core particles at the final stage and which discharges the mixture of a gas and the particles in the powder of highly dispersed core particles. Shown by ϵ is a mixture of a gas and the particles in a powder of highly dispersed core particles which are part of the particles in the powder of core particles and which are present in a gaseous atmosphere mainly in a single-particle state.

Design 7

Figure 3G:
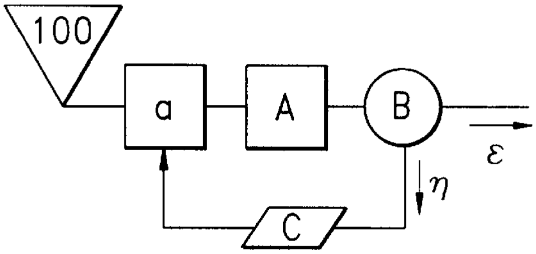

FIG. 3*g* is a block diagram illustrating a seventh specific design of the group of means for high dispersion treatment of fine particles of the present invention and the drawing corresponds to FIG. 2*c*. The group shown in FIG. 3*g* is composed of a supply vessel 100 for supplying the powder of core particles to be coated, dispersing means a for dispersing the powder of core particles to be coated, a final dispersing means A for dispersing the powder of core particles to be coated, feedback means a by which a mixture of a gas and the particles in a powder of less highly dispersed core particles as separated from a mixture of a gas and the particles in a powder of highly dispersed particles in which the powder particles are present in a gaseous atmosphere mainly in a single-particle state is fed back from the mixture of a gas and the particles in the powder of core particles (which have been dispersed by the final dispersing means A) to the dispersing means A, and final means B for selecting the mixture of a gas and the particles in the powder of highly dispersed core particles at the final stage and which discharges the mixture of a gas and the particles in the powder of highly dispersed core particles.

To maintain the thus achieved high dispersive state of the fine particles, means for maintaining dispersion in a gaseous atmosphere may be added to the group of means for high dispersion treatment of fine particles. The term "means for maintaining dispersion in a gaseous atmosphere" as used herein refers to means that maintains a desired value of dispersity β by preventing reagglomeration of the particles in the powder of core particles that have been carried dispersively in a gaseous atmosphere. To promote the thus achieved high dispersive state of the core particles, means for promoting dispersion in a gaseous atmosphere may be added between the group of means for high dispersion treatment of fine particles and the coating chamber. The term "means for promoting dispersion in a gaseous atmosphere" as used herein refers to means which is primarily intended to promote the redispersion of that part of the particles in the powder of core particles carried dispersively in a gaseous atmosphere which have agglomerated again, thereby retarding the drop in the dispersive state of the powder; the term also refers to means that promotes redispersion in such a way that the state of dispersion that has dropped once can be restored to the initial high dispersive state.

Advantageous examples of said means for maintaining dispersion in a gaseous atmosphere or promoting dispersion in a gaseous atmosphere include a pipe vibrator, a pipe heater, a plasma generator, an electric charger, etc.

The pipe vibrator is means in which a pipe equipped with an oscillator is vibrated to provide the particles dispersed in a gaseous atmosphere with vibrations uncomparable to those imparted by dispersers, whereby reagglomeration is suppressed to maintain the high dispersive state or the dispersion of reagglomerating particles is promoted.

The pipe heater is means in which a heated pipe imparts heat to a carrier gas from outside, thereby expanding the carrier gas so that its flow velocity is accelerated to a level that is too fast to be comparable to that achieved by dispersers, whereby reagglomeration of the particles is suppressed while promoting the dispersion of reagglomerating particles.

The plasma generator is means in which a plasma is generated in the gaseous atmosphere which dispersively caries the powder of core particles, with the resulting plasma ions being allowed to impinge against the core particles, whereby reagglomeration is suppressed to maintain the high dispersive state or the dispersion of reagglomerating particles is promoted.

The electric charger is means in which corona discharge, electron beams, radiations or some other method is used to generate monopolar ions in the gaseous atmosphere which dispersively carries the powder of core particles, which are subsequently passed through the monopolar ion atmosphere to be charged to a single polarity, whereupon electrostatic repulsive forces either suppress reagglomeration to maintain the high dispersive state or promote the dispersion of reagglomerating particles.

The powder of fine core particles which have been rendered to assume a highly dispersive state in the manner described on the foregoing pages is sent to the coating chamber so that the surfaces of the particles are coated with the coat forming substance. The coating compartment is provided with the coating space including the coating start region.

The group of means for high dispersion treatment of fine particles is desirably coupled directly to the coating chamber. If necessary, they may be connected together by means of a hollow member and/or a pipe that are indispensable to transport. In this case, too, it is essential that the dispersity β of at least 70% in the coating start region is realized.

If the group of means for high dispersion treatment of fine particles is coupled to the coating chamber located separately, the powder of core particles suffices to be introduced into the coating chamber as it maintains the state of dispersion that has been achieved by said group of means for high dispersion treatment of particles. To this end, means for maintaining dispersion in a gaseous atmosphere (which is a device for maintaining the state of dispersion of the powder of core particles) and/or means for promoting dispersion in a gaseous atmosphere (which is a device for enhancing the state of dispersion) and/or means for selecting a mixture of a gas and the particles in a powder of highly dispersed particles (which separates the powder portion of less highly dispersed core particles from the mixture of a gas and the particles in the powder of core particles, thereby selecting a mixture of a gas and the particles in a powder of highly dispersed core particles, the major part of which comprises particles in a single-particle state) may be provided between the group of means for high dispersion treatment of particles and the coating chamber.

If the group of means for high dispersion treatment of fine particles is connected to the coating chamber via means for selecting the mixture of the gas and particles in the powder of highly dispersed particles which selects and separates the particles in the less high dispersive state which consist of chiefly agglomerated particles and the powder of the core particles in the high dispersive state with the dispersity β being adjusted to at least 70% which consist of chiefly primary particles, whereby sending to the coating chamber only a part in the high dispersive state with dispersity β of at least 70%, the coating treatment is conducted effectively.

In the present invention, the group of means for high dispersion treatment of fine particles may share one or more portions of the space with (1) the coating chamber, (2) the coating space or (3) the coating start region.

For example, the group of means for high dispersion treatment of fine particles may share its dispersing space with the coating chamber, or with the coating space having the coating start region, or with the coating start region.

The term "coating start region" as used herein refers to the region where the precursor of the coat forming substance that has been generated via the vapor phase and/or the precursor of the coat forming substance in a vapor-phase state contacts and/or impinges against the powder of highly dispersed core particles which has been transported in the state of dispersion that has the dispersity β adjusted to at least 70% for a powder of core particles that have an average diameter of no more than 10 μm in the frequency distribution by volume, whereupon coating of the individual particles is started. Five typical embodiments of the coating start region are shown schematically in FIGS. 4a–4e.

In FIGS. 4a–4e, the coating start region is an area indicated by numeral 2.

Figure 4A:
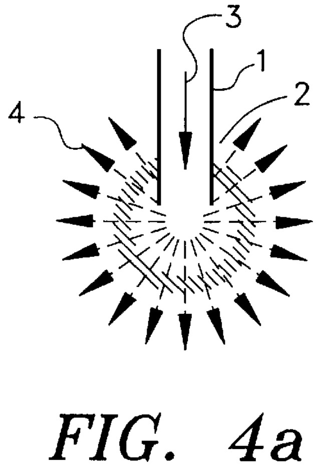
FIGS. 4*a*, 4*b*, 4*c*, 4*d*, and 4*e* are diagrams showing how the coating operation is started on core particles in powder, respectively.

In the case shown in FIG. 4a, the coating start region 2 of the coating space in which the coating of the powder is started as dispersed to at least 70% of dispersity β for the powder is provided in such a way that it surrounds the group of means for high dispersion treatment of fine particles or a part of said group, preferably, a discharge section 1 of said group.

Figure 4B:
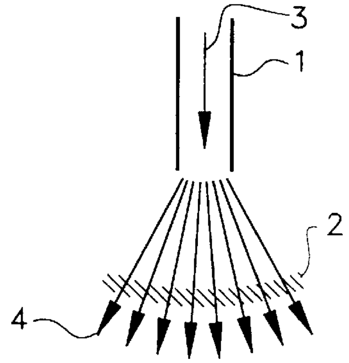

In the case shown in FIG. 4b, the coating start region 2 of said coating space is provided in such a way that it is passed by all the particles 4 in the powder of core particles as they are discharged from the group of means for high dispersion treatment or a part of said group, preferably, a discharge section 1 of said group.

By adopting these arrangements, the particles in all powders of core particles can start to be coated as they are dispersed to at least 70% of dispersity β.

Figure 4C:
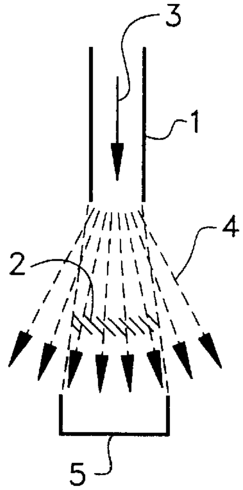

In the case shown in FIG. 4c, the coating start region 2 of said coating space is provided in such a way that it is passed in all cases by those particles 4 in the powder of core particles which are discharged from the group of means for high dispersion treatment of fine particles or a part of said group, preferably, a discharge section 1 of said group to enter the recovery section 5.

Figure 4D:
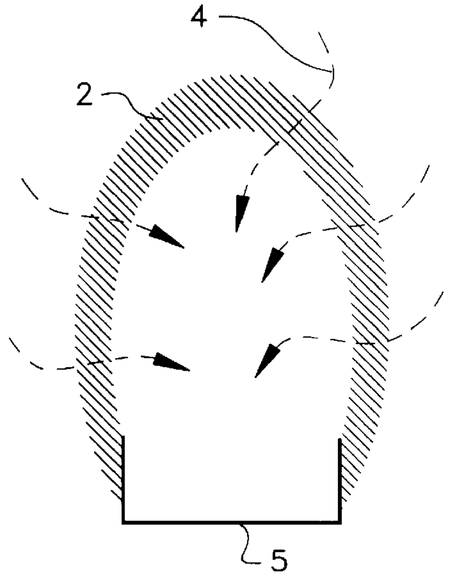

In the case shown in FIG. 4d, the coating start region 2 of said coating space is provided in such a way that it surrounds the recovery section 5.

Figure 4E:
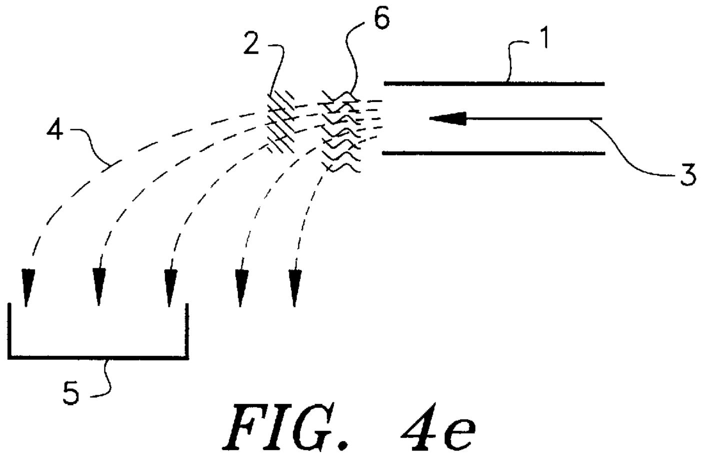

In the case shown in FIG. 4e, the recovery section 5 is provided in a position that can be reached solely by the particles in the mixture of a gas and the particles in the powder of highly dispersed core particles. Hence, the region indicated by 6 in FIG. 4e is selection means using gravity. The coating start region 2 of said coating space is provided in the hatched area of FIG. 4e so that it is passed in all cases by those particles in the mixture of a gas and the particles in the powder of highly dispersed core particles which enter the recovery section. This arrangement insures that only the core particles that started to be coated as they were dispersed to at least 70% of dispersity β can be recovered and there is no chance that the core particles that did not pass through the coating start region will intermingle with the coated particles which emerge from the coating start region.

As one can understand from the foregoing description, the apparatus for implementing the present invention are composed of the group of means for high dispersion treatment of fine particles, the coating chamber and the recovery means. The constituent elements of the apparatus can be combined in various manners and several designs of these apparatus are described below with reference to drawings.

Apparatus Design 1

Figure 5A:
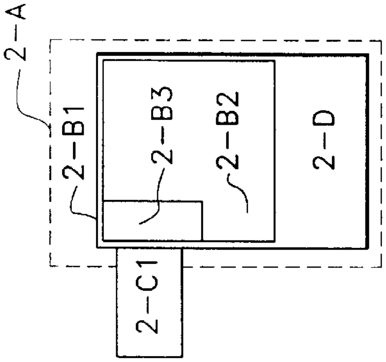
FIGS. 5*a*, 5*b*, 5*c*, 5*d*, 5*e*, 5*f*, and 5*g* are block diagrams showing the compositions of various apparatus of the present invention, respectively.

FIG. 5a is a block diagram showing the construction of a first apparatus for carrying out the present invention. As shown, the apparatus is composed of the main body of the production equipment 2-A (coating apparatus), coating chamber 2-B1, coating space 2-B2, coating start region 2-B3, the group of means for high dispersion treatment of fine particles 2-C1, and recovery means 2-D. The group of means for high dispersion treatment of fine particles 2-C1 is coupled directly to the coating chamber 2-B1.

Apparatus Design 2

Figure 5B:
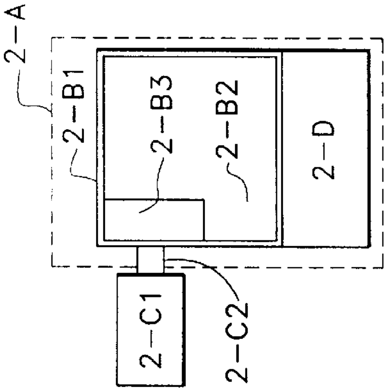

FIG. 5b is a block diagram showing the construction of a second apparatus for carrying out the present invention. As shown, the apparatus is composed of the main body of the production equipment 2-A (coating apparatus), coating chamber 2-B1, coating space 2-B2, coating start region 2-B3, the group of means for high dispersion treatment of fine particles 2-C1, indispensable hollow member 2-C2, and recovery means 2-D. The group of means for high dispersion treatment of fine particles 2-C1 is connected to the coating chamber 2-B1 via the indispensable hollow member 2-C2.

Apparatus Design 3

Figure 5C:
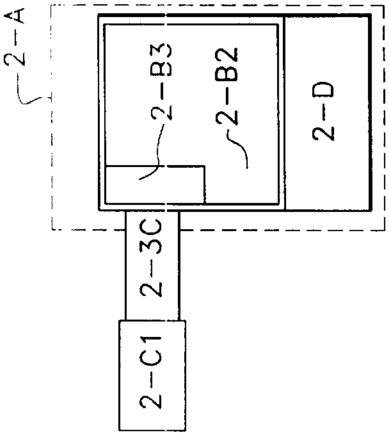

FIG. 5c is a block diagram showing the construction of a third apparatus for carrying out the present invention. As shown, the apparatus is composed of the main body of the production equipment 2-A (coating apparatus), coating chamber 2-B1, coating space 2-B2, coating start region 2-B3, the group of means for high dispersion treatment of fine particles 2-C1, means for maintaining dispersion in gaseous atmosphere 2-C3, and recovery means 2-D. The group of means for high dispersion treatment of fine particles 2-C1 is connected to the coating chamber 2-B1 via the means for maintaining dispersion in gaseous atmosphere 2-C3.

Apparatus Design 4

Figure 5D:
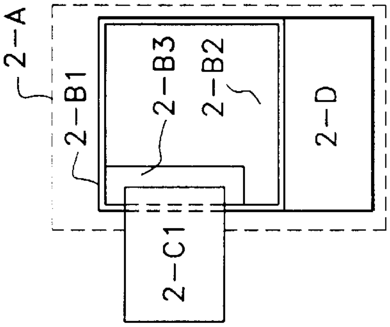

FIG. 5*d* is a block diagram showing the construction of a fourth apparatus for carrying out the present invention. As shown, the apparatus is composed of the main body of the production equipment 2-A (coating apparatus), coating chamber 2-B1, coating space 2-B2, coating start region 2-B3, the group of means for high dispersion treatment of fine particles 2-C1, and recovery means 2-D. The group of means for high dispersion treatment of fine particles 2-C1 shares space with the coating chamber 2-B1.

Apparatus Design 5

Figure 5E:
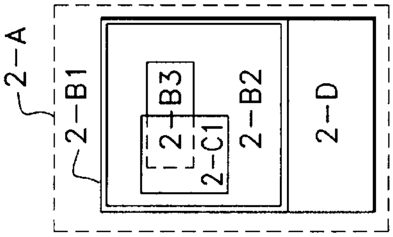

FIG. 5*e* is a block diagram showing the construction of a fifth apparatus for carrying out the present invention. As shown, the apparatus is composed of the main body of the production equipment 2-A (coating apparatus), coating chamber 2-B1, coating space 2-B2, coating start region 2-B3, the group of means for high dispersion treatment of fine particles 2-C1, and recovery means 2-D. The group of means for high dispersion treatment of fine particles 2-C1 is provided within the coating chamber 2-B1.

Apparatus Design 6

Figure 5F:
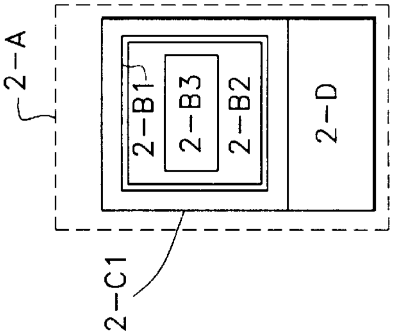

FIG. 5*f* is a block diagram showing the construction of a sixth apparatus for carrying out the present invention. As shown, the apparatus is composed of the main body of the production equipment 2-A (coating apparatus), coating chamber 2-B1, coating space 2-B2, coating start region 2-B3, the group of means for high dispersion treatment of fine particles 2-C1, and recovery means 2-D. The coating chamber 2-B1 is provided within the dispersing space of the group of means for high dispersion treatment of fine particles 2-C1.

Apparatus Design 7

Figure 5G:
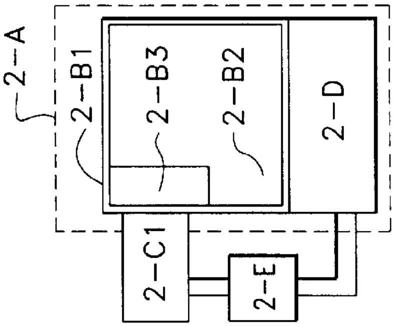

FIG. 5*g* is a block diagram showing the construction of a seventh apparatus for carrying out the present invention. As shown, the apparatus is composed of the main body of the production equipment 2-A (coating apparatus), coating chamber 2-B1, coating space 2-B2, coating start region 2-B3, the group of means for high dispersion treatment of fine particles 2-C1, recovery means 2-D, and recoating supply means 2-E. The coated particles issuing from the recovery means 2-D can be transported by the recoating supply means 2-E to the group of means for high dispersion treatment of fine particles 2-C1 for performing repeated coating treatments.

All of the apparatuses of these designs are involved in the present invention.

The coated particles in which the powder of core particles has its surface coated with the coat forming substance may be coated again with the coat forming substance or subjected to repeated recoating operations. In these cases, the coated particles are sent to the recoating supply means. The term "recoating supply means" as used herein refers to means for transporting the coated particles to the group of means for high dispersion treatment of fine particles to perform recoating. Specifically, the recoating supply means is furnished with (a) means for recovering the coated particles and (b) means for transporting the coated particles from the recovery means (a) to the group of means for high dispersion treatment of fine particles. Alternatively, the recoating supply means is furnished with (a) means for recovering the coated particles, (b) means for transporting the coated particles from the recovery means (a) to the group of means for high dispersion treatment of fine particles, and (c) means for classifying the coated particles. Given large coating weights, the particle size distribution of the coated particles will vary from that of the particles in the powder of uncoated core particles. Under these conditions, it is effective to perform the recoating operation after the particle size distribution of the coated particles is adjusted by the classifying means.

The recoating operation may be repeated depending on the need and the coating weight of the coat forming substance can be set to a desired level. If necessary, the coating operation may be repeated with the type of the coat forming substance varied and, thus, a substance of more than one component can be coated in multiple layers as the coat forming substance.

Even if the coated particles after coating are mixed with the core particles before coating, it is all right that the individual particles are able to be coated.

The equipment for producing coated particles that is to be applied to the present invention is in no way limited as long as it is capable of applying the coat forming substance over the surfaces of the particles in the powder of core particles by vapor-phase processes involving transition through the vapor phase. For example, chemical vapor deposition (CVD) equipment can be used, as exemplified by a thermal CVD apparatus, a plasma-assisted CVD apparatus, apparatus for CVD utilizing electromagnetic waves (i.e., visible light CVD, laser CVD, ultraviolet CVD, infrared CVD and far-infrared CVD) and a MOCVD apparatus. Alternatively, physical vapor deposition (PVD) equipment can be used, as exemplified by a vacuum evaporation apparatus, an ion sputtering apparatus and an ion plating apparatus. Stated more specifically, a suitable apparatus for producing coated particles is described in the official gazette of Unexamined Published Japanese Patent Application (kokai) Hei 3-75302, entitled "Particles Coated with Superfine Grains on the Surfaces and A Process for Producing Such Coated Particles".

As described on the foregoing pages, the process of the present invention for producing coated particles comprises the steps of charging into the coating space the particles in the powder of fine core particles or core particles consisting of chiefly fine particles and then permitting the precursor of the coat forming substance which is generated via the vapor phase and/or the precursor of the coat forming substance in a vapor-phase state to contact and/or impinge against the particles in said powder of core particles so that their surfaces are coated with the coat forming substance. Basic processes of the present invention are summarized below.

I. A coating method comprising:

(A) a dispersing step in which the particles in the powder of fine core particles or core particles consisting chiefly of fine particles which have the average diameter no more than 10 $\mu$m in terms of frequency distribution by volume are dispersed in a gaseous atmosphere by the group of means for high dispersion treatment of fine particles so as to make a mixture of a gas and the particles in a powder of highly dispersed core particles; and (B) a coating step in which the core particles in said gas-particle mixture, as they have been dispersed with the dispersity $\beta$ adjusted to at least 70%, are allowed to contact and/or impinge against the coat forming substance in the coating start region of the coating space, thereby starting the coating operation.

II. A coating method comprising:

(A) a dispersing step in which the particles in the powder of fine core particles or core particles consisting chiefly of fine particles which have the average diameter no more than 10 μm in terms of frequency distribution by volume are dispersed in a gaseous atmosphere by the group of means for high dispersion treatment of fine particles which realize the adjustment of dispersity β to at least 70%, thereby making a mixture of a gas and the particles in a powder of highly dispersed core particles; and (B) a coating step in which the core particles in said gas-particle mixture, as they have been dispersed with the dispersity β adjusted to at least 70%, are allowed to contact and/or impinge against the coat forming substance in the coating start region of the coating space, thereby starting the coating operation.

III. A coating method comprising:

(A) a dispersing step in which the particles in the powder of fine core particles or core particles consisting chiefly of fine particles which have the average diameter no more than 10 μm in terms of frequency distribution by volume are dispersed in a gaseous atmosphere by the group of means for high dispersion treatment of fine particles which realize the adjustment of dispersity β to at least 70%, thereby making a mixture of a gas and the particles in a powder of highly dispersed core particles;

(B) a transport step in which the highly dispersed core particles in said gas-particle mixture are transported directly to a subsequent coating step; and (C) the coating step in which the transported core particles in said gas-particle mixture, as they have been dispersed with the dispersity β adjusted to at least 70%, are allowed to contact and/or impinge against the coat forming substance in the coating start region of the coating space, thereby starting the coating operation.

IV. A coating method comprising:

(A) a dispersing step in which the particles in the powder of fine core particles or core particles consisting chiefly of fine particles which have the average diameter no more than 10 μm in terms of frequency distribution by volume are dispersed in a gaseous atmosphere by the group of means for high dispersion treatment of fine particles which realize the adjustment of dispersity β to at least 70%, thereby making a mixture of a gas and the particles in a powder of highly dispersed core particles;

(B) a transport step in which the highly dispersed core particles in said gas-particle mixture are transported via at least one member indispensable to transport that is selected from the group consisting of a hollow member, an intermediate member composed of a member that forms a hollow portion, and a pipe; and (C) a coating step in which the transported core particles in said gas-particle mixture, as they have been dispersed with the dispersity β adjusted to at least 70%, are allowed to contact and/or impinge against the coat forming substance in the coating start region of the coating space, thereby starting the coating operation.

V. A coating method comprising:

(A) a dispersing step in which the particles in the powder of fine core particles or core particles consisting chiefly of fine particles which have the average diameter no more than 10 μm in terms of frequency distribution by volume are dispersed in a gaseous atmosphere by the group of means for high dispersion treatment of fine particles which realize the adjustment of dispersity β to at least 70%, thereby making a mixture of a gas and the particles in a powder of highly dispersed core particles;

(B) a transport step in which the highly dispersed core particles in said gas-particle mixture are transported via at least one means selected from the group consisting of means for maintaining the dispersion in a gaseous atmosphere of highly dispersed core particles in said gas-particle mixture, means for enhancing the dispersion in a gaseous atmosphere of the highly dispersed core particles in said gas-particle mixture, and means for separating a mixture of a gas and the particles in a powder of less highly dispersed core particles from said gas-particle mixture so as to select a mixture of a gas and the particles in a powder of highly dispersed core particles in which the core particles are present in the gaseous atmosphere mainly in a single-particle state; and (C) the coating step in which the transported core particles in said mixture of a gas and the powder of highly dispersed core particles, as they have been dispersed with the dispersity β adjusted to at least 70%, are allowed to contact and/or impinge against the coat forming substance in the coating start region of the coating space, thereby starting the coating operation.

In each of the coating methods I–V, it is preferred that the coating start region of the coating space is located in the space region that includes planes through which all particles of the particles in the powder of the core particles in the mixture of the gas and the particles in the highly dispersed core particles will pass within the space region in which the particles in the powder of the core particles in the mixture of the gas and the particles in the highly dispersed core particles are allowed to disperse the particles in the powder of the core particles or core particles consisting chiefly of fine particles which have the average diameter no more than 10 μm in terms of frequency distribution by volume by the group of means for high dispersion treatment to fine particles are realized that the dispersity β is adjusted to at least 70%; or it is preferred that the coating start region of the coating space is located in the space region that includes planes through which all particles to be recovered into the recovery section of the recovery means will pass within the space region in which the particles in the powder of the core particles in the mixture of the gas and the particles in the highly dispersed core particles are allowed to disperse the particles in the powder of the core particles or core particles consisting of chiefly fine particles which have the average diameter no more than 10 μm in terms of frequency distribution by volume by the group of means for high dispersion treatment to fine particles are realized that the dispersity β is adjusted to at least 70%.

Alternatively, in each of the coating methods I and II, it is preferred that at least one part of the dispersing step, in which the particles in the powder of fine core particles or core particles consisting chiefly of fine particles which have the average diameter no more than 10 μm in terms of frequency distribution by volume are dispersed in a gaseous atmosphere by the group of means for high dispersion treatment of fine particles which realize the adjustment of dispersity β to at least 70%, thereby making a mixture of a gas and the particles in a powder of highly dispersed core particles, is performed sharing one or more parts of the space with at least one part of the coating step.

EXAMPLES

Next, the present invention will be described in greater detail with reference to examples.

Example 1

Figure 6:
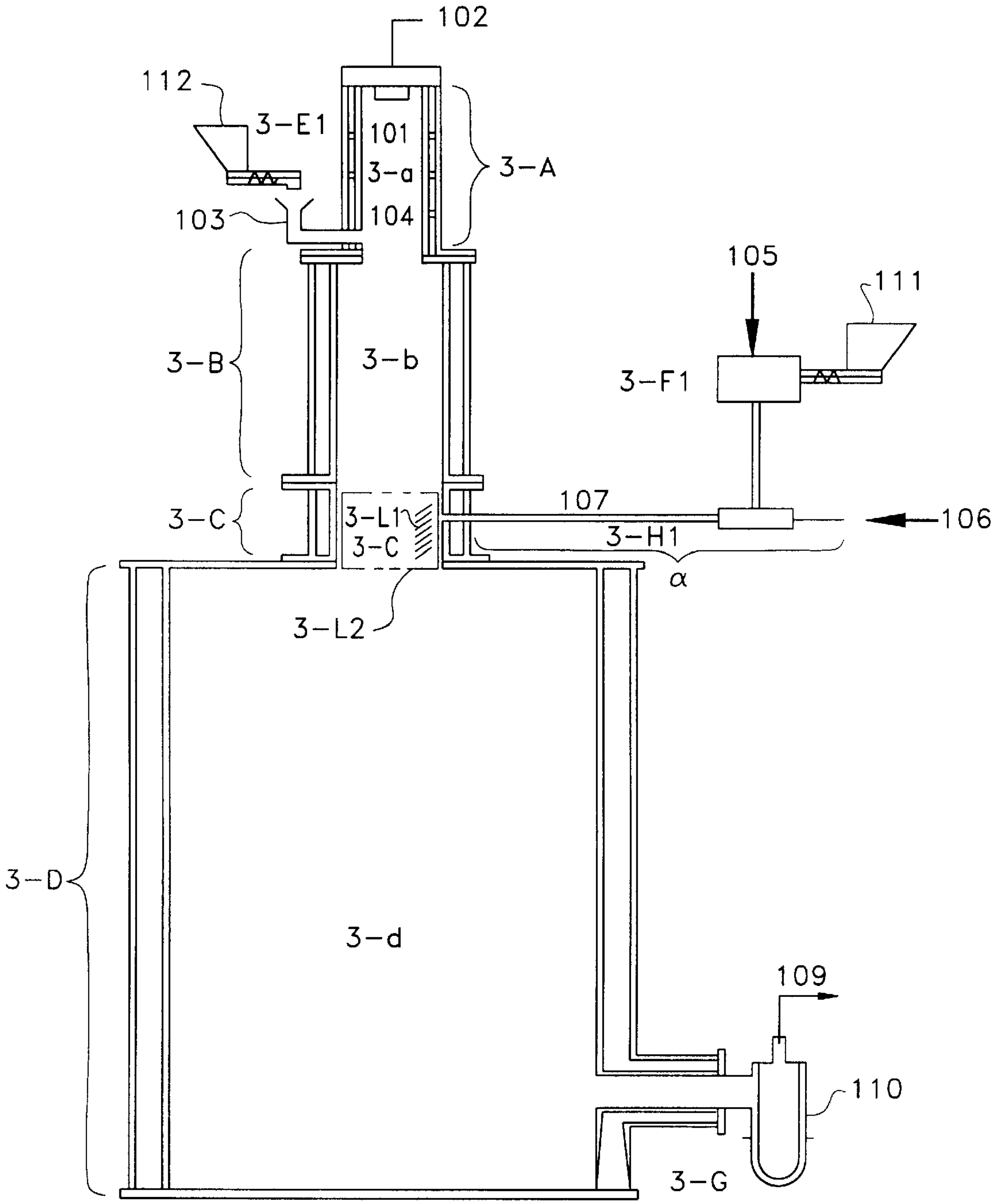
FIG. 6 is a diagram showing the apparatus in Example 1.
Figure 7:
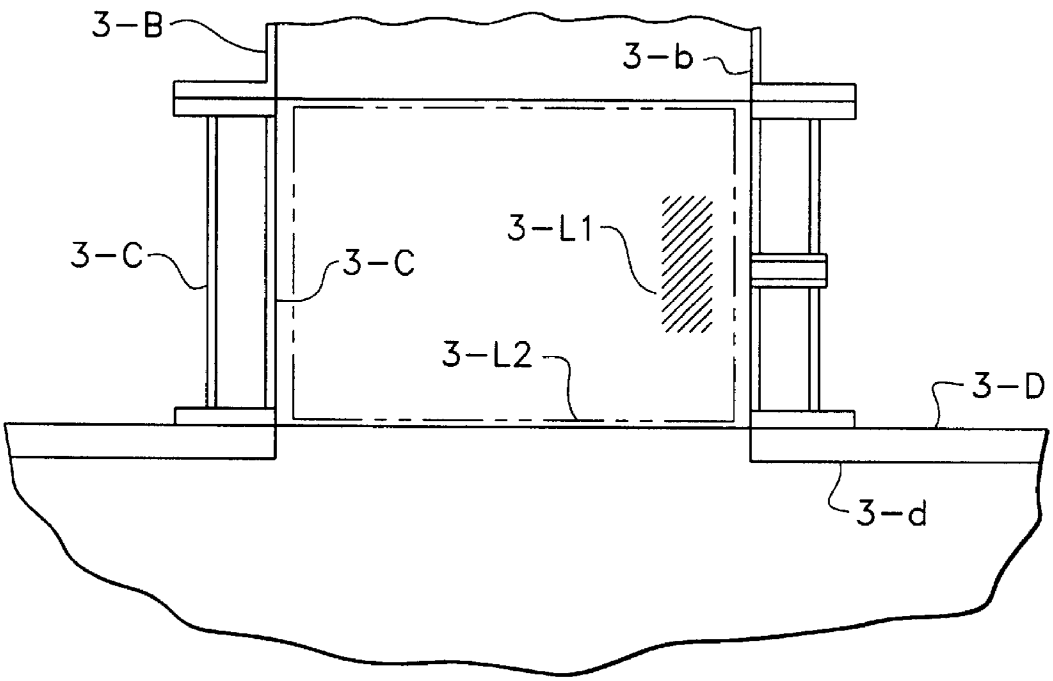
FIG. 7 is a partial enlarged view of the apparatus in Example 1.

We describe below in detail with reference to the example of the present invention as shown in FIG. 6 which is a specific example of the apparatus having the construction shown in FIG. 5*a* and FIG. 7 which is a partial enlarged view of FIG. 6.

As shown, the apparatus comprises: a plasma torch 3-A including a plasma chamber 3-*a*, a vessel 3-B for cooling a coat forming substance precursor generating chamber 3-*b*, a coating chamber cooling vessel 3-C in the narrow sense of the term, a coating chamber 3-*c* in the narrow sense of the term, a vessel 3-D for cooling a coated particle cooling chamber 3-*d*, a supply unit 3-E1 on the side where the feed of the coat forming substance is supplied, an agitating disperser 3-F1 and an ejector-type disperser 3-H1 which are on the side where a powder of core particles is supplied, a capillary disperser 107, and a coated particle recovery section 3-G. The supply unit 3-E1 is coupled to a feeder 112 equipped with a vessel for supplying the feed powder of the coat forming substance, and the agitating disperser 3-F1 is coupled to a feeder 111 equipped with a vessel for supplying the powder of core particles. According to the definition, the coating chamber used in Example 1 is composed of the plasma chamber 3-*a*, the coat forming substance precursor generating chamber 3-*b*, the coating chamber 3-*c* in the narrow sense of the term, and the coated particle cooling chamber 3-*d*. These make up the coating chamber in the broad sense of the term and the chamber 3-*c* where most part of the coating operation is performed is referred to as the "coating chamber in the narrow sense of the term".

The group of means for high dispersion treatment of fine particles α used in Example 1 is composed of the feeder 111 equipped with a supply vessel, agitating disperser 3-F1, ejector-type disperser 3-H1, and the capillary disperser 107 which is made of a stainless steel pipe having an inside diameter of 4 mm and the construction of the group of means for high dispersion treatment of fine particles is shown in FIG. 2*a*. The group of means for high dispersion treatment of fine particles is designed in such a way that it can realize an output value β of at least 70% (β≧70%) given the powder that are characterized by (($D_M$/5, 5$D_M$), ≧90%) where $D_M$=3 μm. The capillary disperser 107 which is the final means of treatment in the group of means for high dispersion treatment of fine particles is coupled directly to the coating chamber 3-*c* and designed in such a way as to realize β≧70% for the powder that are characterized by (($D_M$/5, 5$D_M$), ≧90%) where $D_M$=3 μm in the coating start region 3-L1 of the coating space 3-L2.

The plasma torch 3-A includes as a main body a quartz tube, for example, having an internal diameter of 44 mm and a length of 150 mm. The quartz tube is surrounded by a high-frequency oscillation coil which is in turn encircles by an outer cooling sleeve. The top of the plasma torch 3-A has three gas jet outlet ports 101, having tangential outlet port, axial outlet port and radial outlet port.

The plasma torch 3-A also includes, at its bottom, a port 104 for supplying a feed of a coat forming substance. It is so designed that the feed powders of the coat forming substance supplied from the feeder equipped with a vessel for supplying the feed of the coat forming substance are introduced into a plasma flame while being carried by a carrier gas 103.

The coat forming substance precursor generating chamber 3-*b* comprises an inner quartz tube having an internal diameter of 120 mm and a length of 200 mm and the outer cooling tube 3-B. The coating chamber 3-C in the narrow sense of the term includes an inner quartz tube having an internal diameter of 120 mm and a length of 100 mm and the outer cooling tube 3-C. The coating chamber 3-*c* in the narrow sense of the term is designed in such a way that the core particles supplied from the feeder 111 equipped with the vessel for supplying the powder of the core particles are dispersed by the group of means for high dispersion treatment of fine particles α comprising the agitating disperser 3-F1, the ejector-type disperser 3-H1 and the capillary disperser 107, and then the dispersed core particles are introduced from a port for supplying the powder of the core particles which is provided in a central portion of the coating chamber 3-*c* in the narrow sense of the term. The coating space 3-L2 and the coating start region of the coating space are provided within the coating chamber 3-*c* in the narrow sense of the term.

The coated particle cooling chamber 3-*d* comprises an inner tube 116 having an internal diameter of 440 mm and a length of 1800 mm and the outer cooling tube 3-D.

An outlet port section 109 of the coated particle recovery section 3-G is connected to a vacuum pump. It is so designed that the coated particles are collected on a filter 110 and then taken out.

Aluminum oxide particles in a powder of fine particles having $D_M$ of 3 μm and the distribution of (($D_M$/5, 5$D_M$), ≧90%) as particles in a powder of core particles were coated with metallic aluminum as the coat forming substance by the apparatus for producing coated particles shown in the example of the present invention.

A gas jet port 101 is provided on top of the plasma torch 3-A and an argon gas is supplied from a supply source 102 through this port at a rate of 20 L/min. The supplied argon gas is turned into a plasma by applied high-frequency waves, thereby forming a plasma flame in the plasma chamber 3-*a* within the plasma torch 3-A.

A metallic aluminum powder serves as the feed of the coat forming substance and is supplied from the feeder 112 equipped with the vessel for supplying the feed powder of the coat forming substance. The supplied aluminum powder is carried by the carrier gas 103 flowing at a rate of 5 L/min so that it is introduced into the plasma flame at a rate of 0.5 g/min via an inlet 104 provided at the bottom of the plasma torch 3-A. The aluminum powder is evaporated by the heat of the plasma flame, and cooled quickly and condensed in the precursor generating chamber 3-*b* to become the precursor of the coat forming substance.

The aluminum oxide core particles are supplied at a rate of 1.5 g/min from the feeder 111 equipped with a supply vessel of the powder of the core particles and they are dispersed with the agitating disperser 3-F1 while being carried by a carrier gas 105 that is supplied at a rate of 5 L/min. The particles are then dispersed in a gaseous atmosphere by means of the ejector-type disperser 3-H1 and the capillary disperser 107 with the aid of a dispersing gas 106 that is supplied at a flow rate of 10 L/min.

The group of means for high dispersion treatment of fine particles of the present example which is composed of the feeder 111 equipped with the supply vessel, the agitating disperser 3-F1, the ejector-type disperser 3-H1 and the capillary disperser 107 is able to disperse the particles in the powder of core particles having $D_M$ of 3 μm and the distribution of (($D_M$/5, 5$D_M$), ≧90%) to the dispersity β of 85% with the capillary disperser 107 as means for final treatment. Or the coating is started in the dispersing state with the dispersity β of 85% at the coating start region of the coating space.

Thus, the coated particles given the coat of the coat forming substance on their surfaces descend down the coated particle cooling chamber 3-*d* together with the gas, eventually reaching the recovery section 3-G. The product comprising the coated particles is separated from the gas by means of a filter 110 and collected for recovery.

Figure 8:
FIG. 8 is a scanning electron micrograph showing one of the coated particles produced in the apparatus in Example 1.

The coated particles recovered, namely the fine aluminum oxide particles having metallic aluminum coats on the surfaces were examined with a scanning electron microscope. As FIG. 8 shows, the individual fine aluminum oxide particles which are primary particles were coated with superfine metallic aluminum particles.

Comparative Example

Figure 9:
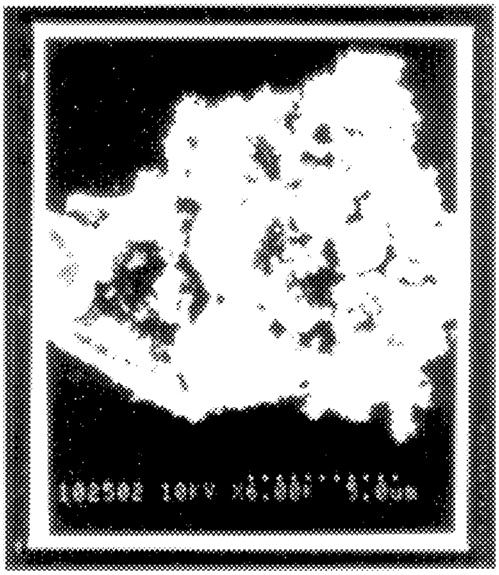
FIG. 9 is an electron micrograph showing one of the coated particles produced in Comparative Example.

Using an apparatus of the same construction as the apparatus used in Example 1 except that the dispersing means is not provided and the powder of fine particles is introduced directly to the coating chamber 3-*c* form the feeder 111, the powder of fine particles made of aluminum oxide as entirely same as that used in Example 1 was covered with the coat forming substance made of metallic aluminum. The dispersity β of the fine aluminum oxide particles was 63% in the inlet port for sending to the coating chamber. The obtained coated particles, namely the fine aluminum oxide particles having metallic aluminum coats on the surfaces were examined with the scanning electron microscope. As FIG. 9 shows, agglomerates of the core particles made of aluminum oxide covered with metallic aluminum were merely obtained.

Example 2

Figure 10:
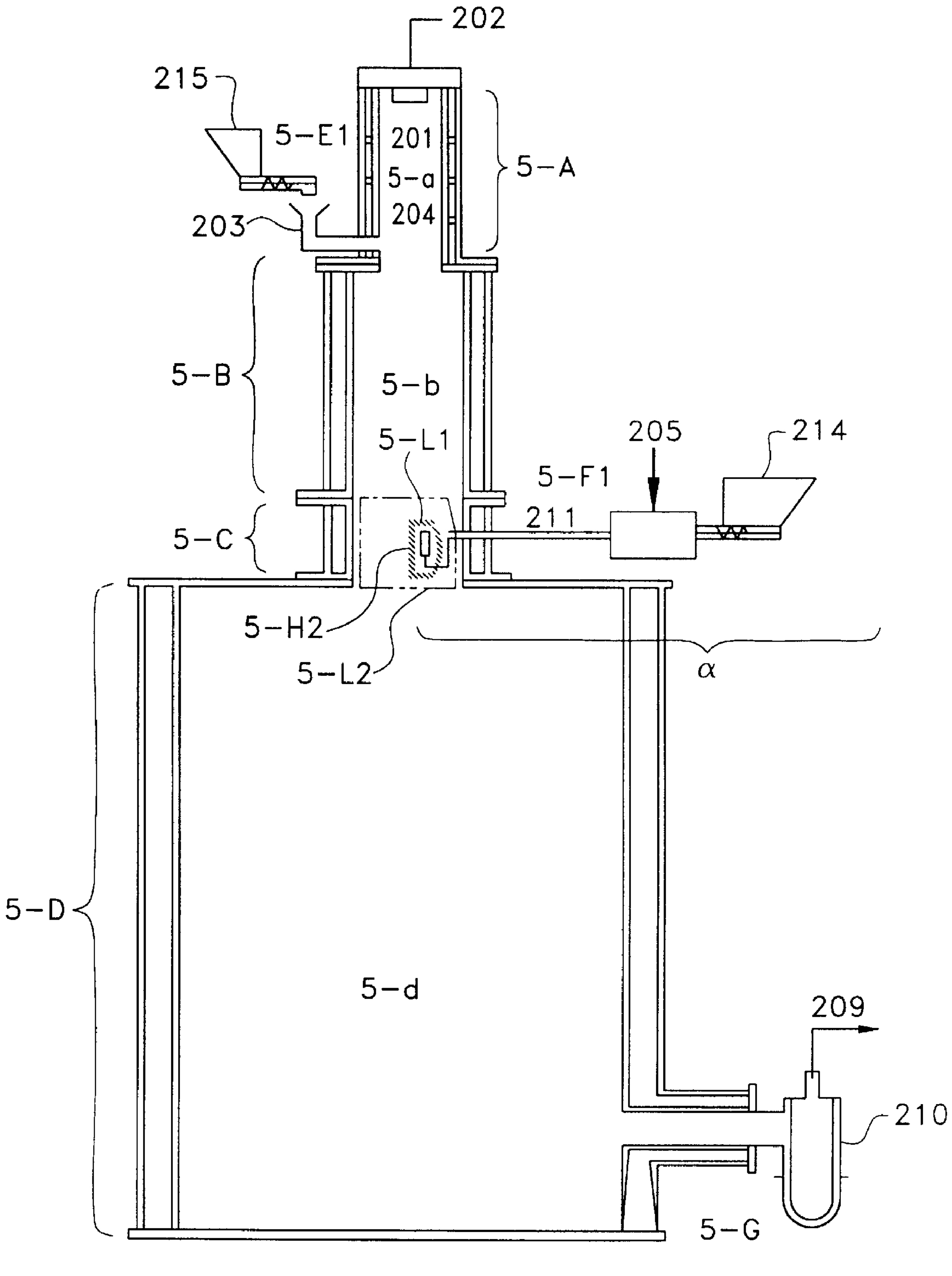
FIG. 10 is a diagram showing the apparatus in Example 2.
Figure 11:
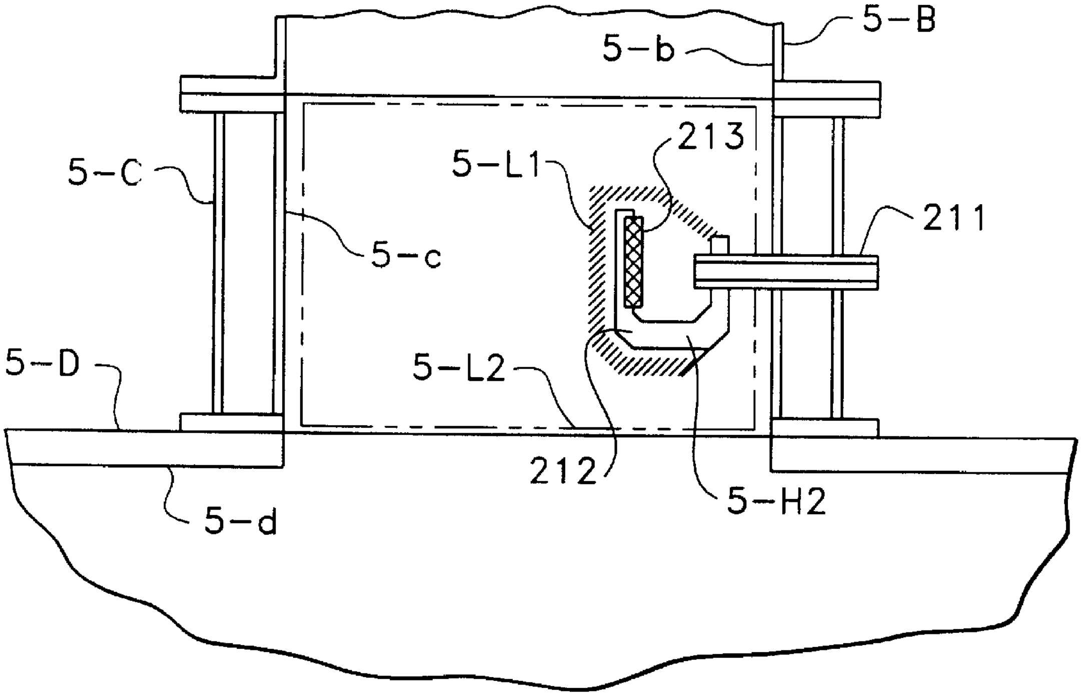
FIG. 11 is a partial enlarged view of the apparatus in Example 2.

The apparatus as shown in FIG. 10 and FIG. 11 which is a partial enlarged view of FIG. 10 is a specific example of the apparatus having the construction shown in FIG. 5*d*.

The construction of the apparatus used in Example 2 which was to generate the precursor of the coat forming substance was of the same design as in Example 1. The group of means for high dispersion treatment of fine particles α was composed of a feeder 214 equipped with a supply vessel, the agitating disperser 5-F1, the capillary disperser 211, and the disperser 5-H2 that utilizes an impingement plate. The basic concept of the group α is one example of the construction of the group of means for high dispersion treatment of fine particles as shown in FIG. 2*a*. The capillary disperser 211 is made of a stainless steel pipe having an inside diameter of 4 mm. The disperser 5-H2 is the final means of treatment in the group of means for high dispersion treatment of fine particles α and it consists of a SiC impingement plate 213 supported by a stainless steel holder 212. The disperser 5-H2 utilizing the impingement plate is contained in the coating chamber 5-*c* in the narrow sense of the term, which shares the space with the group of means for high dispersion treatment of fine particles α. A coating space 5-L1 and the coating start region 5-L2 of the coating space are also contained in the coating chamber 5-*c* in the narrow sense of the term. The group of means α in the apparatus of Example 2 has such performance that the particles in a powder of core particles having an average diameter ($D_M$) of 1 μm and a frequency distribution by volume of $((D_M/5, 5D_M), \geqq 90\%)$ can be dispersed to a dispersity (β) of at least 70% (β≧70%) right after impingement against the impingement plate 215 in the disperser 5-H2 at the last stage of dispersion treatment. Therefore, coating of the core particles starts with the dispersity β held at 70% and above.

Aluminum oxide particles in the powder of fine particles having an average diameter ($D_M$) of 1 μm and a frequency distribution by volume of $((D_M/5, 5D_M), \geqq 90\%)$ as particles in the powder of core particles were coated with metallic aluminum as the coat forming substance by the apparatus for producing coated particles of Example 1.

A gas jet port 201 is provided on top of the plasma torch 5-A and an argon gas is supplied from a supply source 202 through this port at a rate of 20 L/min. The supplied argon gas is turned into a plasma by applied high-frequency waves, thereby forming a plasma flame in a plasma chamber 5-*a* within the plasma torch 5-A.

A metallic aluminum powder serves as the feed of the coat forming substance and is supplied at a rate of 0.5 g/min from a feeder 215 equipped with a vessel for supplying the feed powder of the coat forming substance. The supplied aluminum powder is carried by a carrier gas 203 flowing at a rate of 5 L/min so that it is introduced into the plasma flame via an inlet 204 of the feed of the coat forming substance provided at the bottom of the plasma torch 5-A. Being evaporated by the heat of the plasma flame, the aluminum powder is cooled quickly and condensed in a coat forming substance precursor generating chamber 5-*b* to become the precursor of the coat forming substance.

The core particles of aluminum oxide are supplied at a rate of 1.5 g/min from the feeder 214 equipped with a vessel for supplying the powder of core particles and they are dispersed with the agitating disperser 5-F1 while being carried by a carrier gas 205 that is supplied at a rate of 20 L/min. The particles then pass through the capillary disperser 211 to enter the disperser 5-H2 with the impingement plate in the coating chamber, in which they are dispersed in a gaseous atmosphere to a dispersity (β) of 82%. The core particles dispersed in the coating space start to be coated in the coating start region 5-L1 of the coating space 5-L2 as they maintain the dispersity β of 82%.

Thus, the coated particles given the coat of the coat forming substance on their surfaces descend down a coated particle cooling chamber 5-*d* together with the gas, eventually reaching a coated particle recovery section 5-G. The product comprising the coated particles is separated from the gas by means of a filter 210 and collected for recovery.

The coated particles recovered, that is, fine aluminum oxide particles having metallic aluminum coats on their surfaces were examined with a scanning electron microscope. The individual fine aluminum oxide particles which are primary particles were coated with superfine metallic aluminum particles. The coating form of this coated particles was the same as that of the coated particles obtained in Example 1.

Example 3

Figure 12:
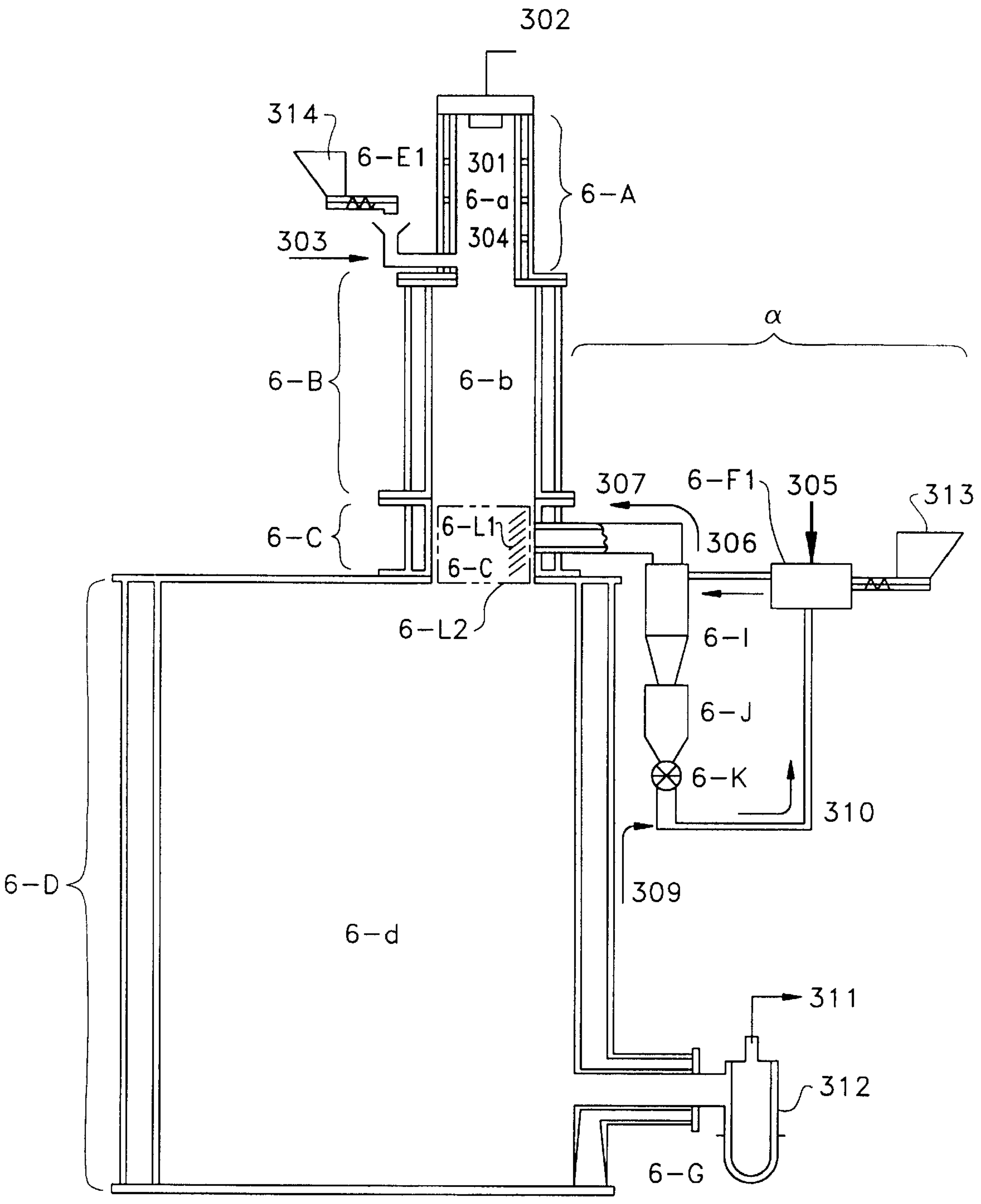
FIG. 12 is a diagram showing the apparatus in Example 3.
Figure 13:
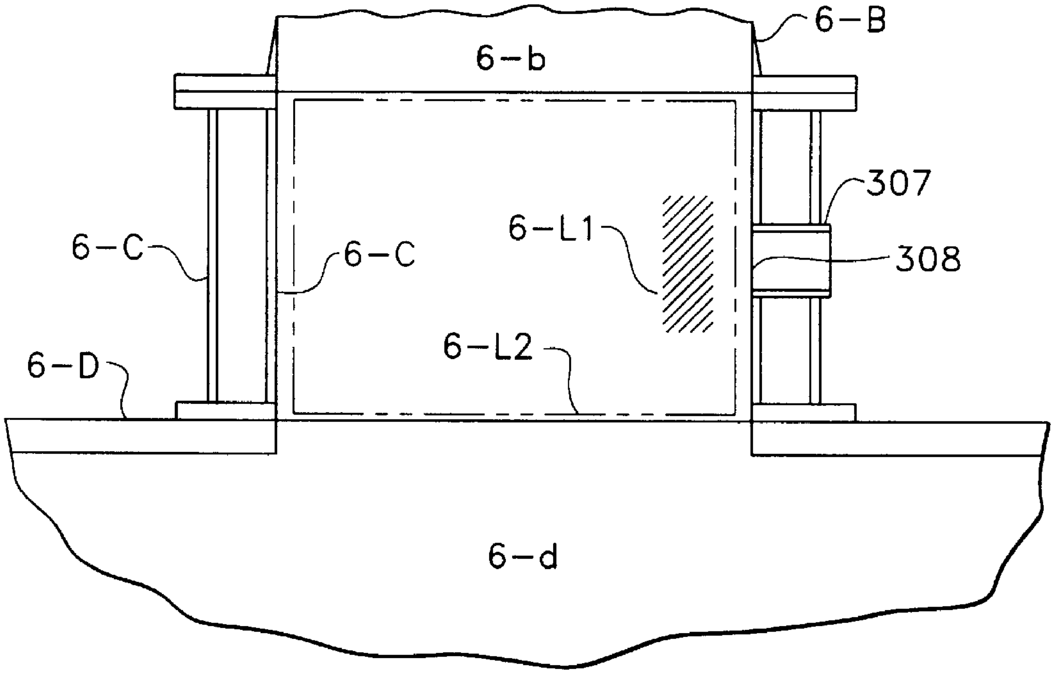
FIG. 13 is a partial enlarged view of the apparatus in Example 3.

The apparatus as shown in FIG. 12 and FIG. 13 which is a partial enlarged view of FIG. 13; the apparatus is a specific example of the apparatus having the construction shown in FIG. 5*b*.

The construction of the apparatus used in Example 3 which is to generate the precursor of the coat forming substance was of the same design as in Example 1. The group of means for high dispersion treatment of fine particles α is composed of a feeder 313 equipped with a supply vessel, the agitating disperse 6-F1 which is dispersing means, and the cyclone 6-I which is means for selecting a mixture of a gas and the particles in a powder of highly dispersed core particles. The basic concept of the group α is shown in the FIG. 2*b* block diagram. The section of cyclone 6-I discharging the mixture of a gas and the particles in a powder of highly dispersed core particles is connected to the coating chamber 6-*c* in the narrow sense of the term by means of the pipe 307 inevitable to transport, whereas the section of cyclone 6-I discharging the powder portion consisting of less highly dispersed core particles is connected to the agitating disperser 6-F1 by means of a transport pipe 310 via the hopper 6-J and the rotary valve 6-K. Using the group of means α in the apparatus of Example 3, the particles in a powder of core particles corresponding to an average ($D_M$) of 1.5 μm and a frequency distribution by volume of (($D_M$/5, 5$D_M$), ≧90%) can be dispersed to a dispersity (β) of at least 75% in the section of cyclone 6-I (i.e., the means of final treatment) discharging the powder stream of highly dispersed particles. As shown, the coating space 6-L2 and the coating start region 6-L1 of this coating space are contained in the coating chamber 6-*c* in the narrow sense of the term. Because of the constraint by the flange portion coupling a coating chamber cooling vessel 6-C in the narrow sense of the term with the vessel 6-D for cooling the coated particle cooling chamber 6-*d*, the pipe 307 was indispensable to transport, but the resulting drop in dispersity β could be held at a reduced level. Hence, coating of the core particles starts with the dispersity β held at 70% and above in the coating start region.

Aluminum oxide particles in the powder of fine particles having an average diameter ($D_M$) of 1.5 μm and a frequency distribution by volume of (($D_M$/5, 5$D_M$), ≧90%) as particles in the powder of core particles were coated with metallic aluminum as the coat forming substance by the apparatus for producing coated particles of Example 1.

A gas jet port 301 is provided on top of the plasma torch 6-A and an argon gas is supplied from a supply vessel 302 through this port at a rate of 20 L/min. The supplied argon gas is turned into a plasma by applied high-frequency waves, thereby forming a plasma flame in the plasma chamber 6-*a* within the plasma torch 6-A.

A metallic aluminum powder serving as the feed of the coat forming substance is supplied at a rate of 0.5 g/min from a feeder 314 equipped with a vessel for supplying the feed powder of the coat forming substance. The supplied aluminum powder is carried by a carrier gas 303 flowing at a rate of 5 L/min so that it is introduced into the plasma flame via an inlet 304 the feed of the coat forming substance provided at the bottom of the plasma torch 6-A. Being evaporated by the heat of the plasma flame, the aluminum powder is cooled quickly and condensed in the coat forming substance precursor generating chamber 6-*b* to become the precursor of the coat forming substance.

The core particles of aluminum oxide are supplied at a rate of 1.5 g/min from the feeder 313 equipped with a vessel for supplying the powder of core particles and they are dispersed with the agitating disperser 6-F1 while being carried by a carrier gas 305 that is supplied at a rate of 15 L/min. The particles then pass through a pipe 306 and thence enter the cyclone 6-I. The cyclone 6-I is adjusted in such a way that the fines produced will have a maximum particle diameter of 2 μm; a mixture of the gas and the particles in a powder of highly dispersed core particles which are mostly single particles passes through the pipe 307 which is indispensable to transport, so that it is discharged into the coating chamber 6-*c* in the narrow sense of the term via a discharge port 308. On the other hand, the powder stream of dispersed core particles in the mixture of the gas and the particles in the powder of less highly dispersed core particles consist chiefly of agglomerated particles, which have been selectively separated by cyclone 6-I passes through hopper 6-J and rotary valve 6-K to be transported through a pipe 310 by a carrier gas 309 flowing at a rate of 10 L/min so that it is fed back to the agitating disperser 6-F1. The dispersity attainable in the discharge section of the group of means for high dispersion treatment of fine particles, that is, the discharge section of the cyclone 6-I for discharging the mixture of the gas and the particles in the powder of highly dispersed core particles is 85% by the dispersity β whereas the dispersity attainable in the coating start region 6-L1 of the coating space is 80% by the dispersity β.

Thus, the coated particles given the coat of the coat forming substance on their surfaces descend down a coated particle cooling chamber 6-*d* together with the gas, eventually reaching a coated particle recovery section 6-G. The product comprising the coated particles is separated from the gas by means of a filter 312 and collected for recovery.

The fine aluminum oxide particles having metallic aluminum coats on the surfaces which were the coated particles recovered were examined with a scanning electron microscope. The individual fine aluminum oxide particles which were primary particles were uniformly coated with superfine metallic aluminum particles. The coating form of this coated particles was the same as that of the coated particles obtained in Example 1.

Industrial Applicability

According to the process and apparatus for producing coated particles, individual particles can be covered with the coat forming substance even the particles are in powder of fine core particles or core particles consisting chiefly of fine particles, yielding no uncoated particles nor particles having uncoated portions caused by formation of coated agglomerates covered on the surface with the coat forming substance. In view of the fact that uncoated particles or particles having uncoated portion are not in existence, the merits on the industrial outputs are extremely large.

We claim:

1. A process for producing coated particles comprising the step of:

charging a powder of core particles into a coating space; and then permitting a precursor of a coat forming substance which is generated via the vapor phase and/or a precursor of a coat forming substance in a vapor-phase state to contact and/or impinge against the particles in said powder of core particles so that their surfaces are coated with the coat forming substance;

wherein said process for producing the coated particles further comprises:

(A) a dispersing step in which the particles in the powder of fine core particles or core particles comprising fine particles, in which the fine core particles or fine particles have an average diameter no more than 10 μm in a frequency distribution by volume are dispersed by a group of means for high dispersion treatment of fine particles in a gaseous atmosphere to form a mixture of a gas and the particles in a powder of highly dispersed particles, a final treating means in said group of means for high dispersion treatment of fine particles being selected from between:

(a) dispersing means for dispersing the particles in the powder of core particles in a gaseous atmosphere; and (b) means for selecting a mixture of a gas and the particles in a powder of highly dispersed particles which comprises:

means for selecting a mixture of a gas and the particles in a powder of highly dispersed particles that separates a portion of the powder that is composed of less highly dispersed particles from the mixture of a gas and the particles in the powder of core particles in which the particles in the powder of core particles are dispersed in a gaseous atmosphere, thereby selecting a mixture of a gas and the particles in a powder of highly dispersed core particles in which the particles in the powder of core particles are present in the gaseous atmosphere mainly in a single-particle state; and feedback means by which the portion of the powder that is composed of less highly dispersed particles and which has been separated by said means for selecting a mixture of a gas and the particles in a powder of highly dispersed particles is transported to a final dispersing means among the dispersing means in the group of means for high dispersion treatment of fine particles and/or treating means upstream of the final dispersing means; and (B) a coating step in which the particles in the powder of core particles that have been dispersed in the dispersing step (A) start to be coated by being allowed to contact and/or impinge against the precursor of the coat forming substance in a coating start region of the coating space as they are dispersed to satisfy such that the dispersity β is at least 70%.

2. A process for producing coated particles according to claim 1 wherein the dispersing step is performed by a group of means for high dispersion treatment of fine particles that has such dispersing performance that a powder of core particles having an average diameter of no more than 10 μm in the frequency distribution by volume is dispersed in a gaseous atmosphere by the final treatment by said group of means for high dispersion treatment of fine particles, thereby forming a mixture of a gas and the particles in the powder of highly dispersed core particles and that the dispersity β of the particles in said powder of core particles is adjusted to at least 70%; and wherein said process further comprises a transporting step in which the mixture of a gas and the particles in the powder of highly dispersed core particles as formed by one of the means in said group of means for high dispersion treatment of particles is discharged directly to the coating step; or transported to the coating step via at least one member selected from the group consisting of a hollow member, an intermediate member composed of a member that forms a hollow portion, and a pipe which is provided between the dispersing and coating steps, as the mixture emerges from a discharge section that discharges said mixture of a gas and the particles; and/or transported via at least one means selected from the group consisting of means for maintaining the dispersion in a gaseous atmosphere of the highly dispersed core particles in the mixture of a gas with the core particles which have been dispersed in the gaseous atmosphere to attain one of the dispersities set forth above, means for adjusting the dispersion in a gaseous atmosphere of the highly dispersed core particles in the mixture of a gas with the core particles which have been dispersed in the gaseous atmosphere to attain one of the dispersities set forth above, and means for separating a mixture of a gas and the particles in a powder of less highly dispersed core particles from said gas-particle mixture so as to select a mixture of a gas and the particles in a powder of highly dispersed core particles in which the core particles are present in the gaseous atmosphere mainly in a single particle state.

3. A process for producing coated particles according to claim 1, wherein at least one part of the dispersing step which is performed by a group of means for high dispersion treatment of the fine particles that has such dispersing performance that a powder of core particles having an average diameter of no more than 10 μm in the frequency distribution by volume is dispersed in a gaseous atmosphere by the final treatment by said group of means for high dispersion treatment of fine particles, thereby forming a mixture of a gas and the particles in the powder of highly dispersed core particles and that the dispersity β of the particles in said powder of core particles is adjusted to at least 70% and at least one part of the coating step is performed in such a way that the dispersing step shares one or more parts of the space with the coating step.

4. A process for producing coated particles according to claim 1, wherein the coating start region of the coating space is located in either of the following portions of the space region in which a powder of core particles that have an average diameter of no more than 10 μm in the frequency distribution by volume is dispersed in a gaseous atmosphere by the final treatment by said group of means for high dispersion treatment of fine particles, thereby forming a mixture of a gas and the particles in the powder of highly dispersed core particles and that the dispersity of β of the particles in said powder of core particles is adjusted to at least 70%:

a space region that includes planes through which all particles in the powder of highly dispersed core particles as mixed with a gas pass, or a space region that includes planes through which all particles to be recovered into the recovery section of the recovery means pass.

5. A process for producing coated particles according to claim 1, wherein the particles in the powder of core particles have a size distribution of $((D_M/5, 5D_M), \geqq 90\%)$ in terms of frequency distribution by volume, where $D_M$ represents the average particle diameter.

6. A coated particle that is produced by the process for producing coated particles as recited in claim 1.

7. A coated particle that is produced by the process for producing coated particles as recited in claim 2.

8. A coated particle that is produced by the process for producing coated particles as recited in claim 3.

9. A coated particle that is produced by the process for producing coated particles as recited in claim 4.

10. A process for producing coated particles, comprising the steps of:

dispersing a powder of core particles in a gaseous atmosphere to form a mixture of a gas and particles in a powder of highly dispersed core particles in such a way that a dispersity β of the metal core particles in the mixture is adjusted to predetermined value depending upon an average diameter of the core particles in a coating start region of a coating space;

starting to coat the particles in the powder of highly dispersed core particles with a coat forming substance by permitting a precursor of the coat forming substance which is generated via the vapor phase and/or a precursor of the coat forming substance in a vapor-phase state to contact and/or impinge against the particles in said powder of highly dispersed core particles in the coating start region of the coating space as the dispersity β should be at least 70%; and coating surface of the particles in said powder of highly dispersed core particles with the coat forming substance by allowing to continue contacting and/or impinging the particles in said powder of highly dispersed core particles against the precursor of the coat forming substance to obtain coated particles.

11. The process of claim 10, wherein said dispersing step comprises:

a) dispersing a powder of less highly dispersed core particles including agglomerated particles, as well as said powder of core particles in the gaseous atmosphere;

b) separating the particles in the powder of less highly dispersed core particles from the particles in the powder of high dispersed core particles, wherein the particles in the powder of highly dispersed core particles are substantially single particles in the gaseous atmosphere;

c) transporting the particles in the powder of less highly dispersed core particles to the step a); and d) repeating steps a), b) and c) on the powder of less highly dispersed core particles to form said mixture of the gas and the particles in the powder of highly dispersed core particles.

* * * * *